US012738921B2

(12) United States Patent
Fujii et al.

(10) Patent No.: US 12,738,921 B2
(45) Date of Patent: Sep. 15, 2026

(54) VIBRATOR DEVICE AND METHOD FOR MANUFACTURING VIBRATOR DEVICE

(71) Applicant: SEIKO EPSON CORPORATION, Tokyo (JP)

(72) Inventors: Masahiro Fujii, Shiojiri (JP); Ryuichi Kurosawa, Suwa-gun Hara-mura (JP)

(73) Assignee: SEIKO EPSON CORPORATION, Tokyo (JP)

( * ) Notice: Subject to any disclaimer, the term of this patent is extended or adjusted under 35 U.S.C. 154(b) by 831 days.

(21) Appl. No.: 18/181,114

(22) Filed: Mar. 9, 2023

(65) Prior Publication Data

US 2023/0291381 A1 Sep. 14, 2023

(30) Foreign Application Priority Data

Mar. 11, 2022 (JP) ................................ 2022-037854

(51) Int. Cl.
*H03H 9/05* (2006.01)
*H03H 9/02* (2006.01)
*H03H 9/19* (2006.01)

(52) U.S. Cl.
CPC ...... *H03H 9/0547* (2013.01); *H03H 9/02992* (2013.01); *H03H 9/19* (2013.01)

(58) Field of Classification Search
CPC .... H03H 9/0547; H03H 9/02992; H03H 9/19; H03H 9/0542; H03H 9/0595
USPC ........................................ 310/348, 365, 366
See application file for complete search history.

(56) References Cited

U.S. PATENT DOCUMENTS

| | | | | |
|---|---|---|---|---|
| 8,154,170 | B2 * | 4/2012 | Kimura ................ | H03H 9/1092 310/365 |
| 8,610,337 | B2 * | 12/2013 | Kawahara ............ | H03H 9/1035 310/365 |
| 2011/0226731 | A1 | 9/2011 | Funabiki et al. | |
| 2020/0382096 | A1 | 12/2020 | Fujiwara | |

FOREIGN PATENT DOCUMENTS

| | | | |
|---|---|---|---|
| JP | 2011-187867 | A | 9/2011 |
| JP | 2011-199673 | A | 10/2011 |
| JP | 2016-131174 | A | 7/2016 |
| JP | 2018-133787 | A | 8/2018 |
| JP | 2019-161458 | A | 9/2019 |
| JP | 2021-136413 | A | 9/2021 |

* cited by examiner

*Primary Examiner* — Derek J Rosenau
(74) *Attorney, Agent, or Firm* — Rankin, Hill & Clark LLP

(57) ABSTRACT

A vibrator device includes: an element substrate including a frame portion having a first surface and a second surface, and a vibrator element disposed inside the frame portion; a first substrate having a third surface and a fourth surface, the first substrate being bonded to the first surface of the frame portion at the third surface; a second substrate having a fifth surface and a sixth surface, the second substrate being bonded to the second surface of the frame portion at the fifth surface; and a cavity surrounded by the frame portion, the first substrate, and the second substrate. The second substrate includes a through electrode at a position overlapping the frame portion in the plan view. An outer shape of the through electrode in the sixth surface in the plan view includes a first portion and a second portion. The first portion is located at a position closer to the cavity than is the second portion. A curvature of the first portion is smaller than a curvature of the second portion.

4 Claims, 17 Drawing Sheets

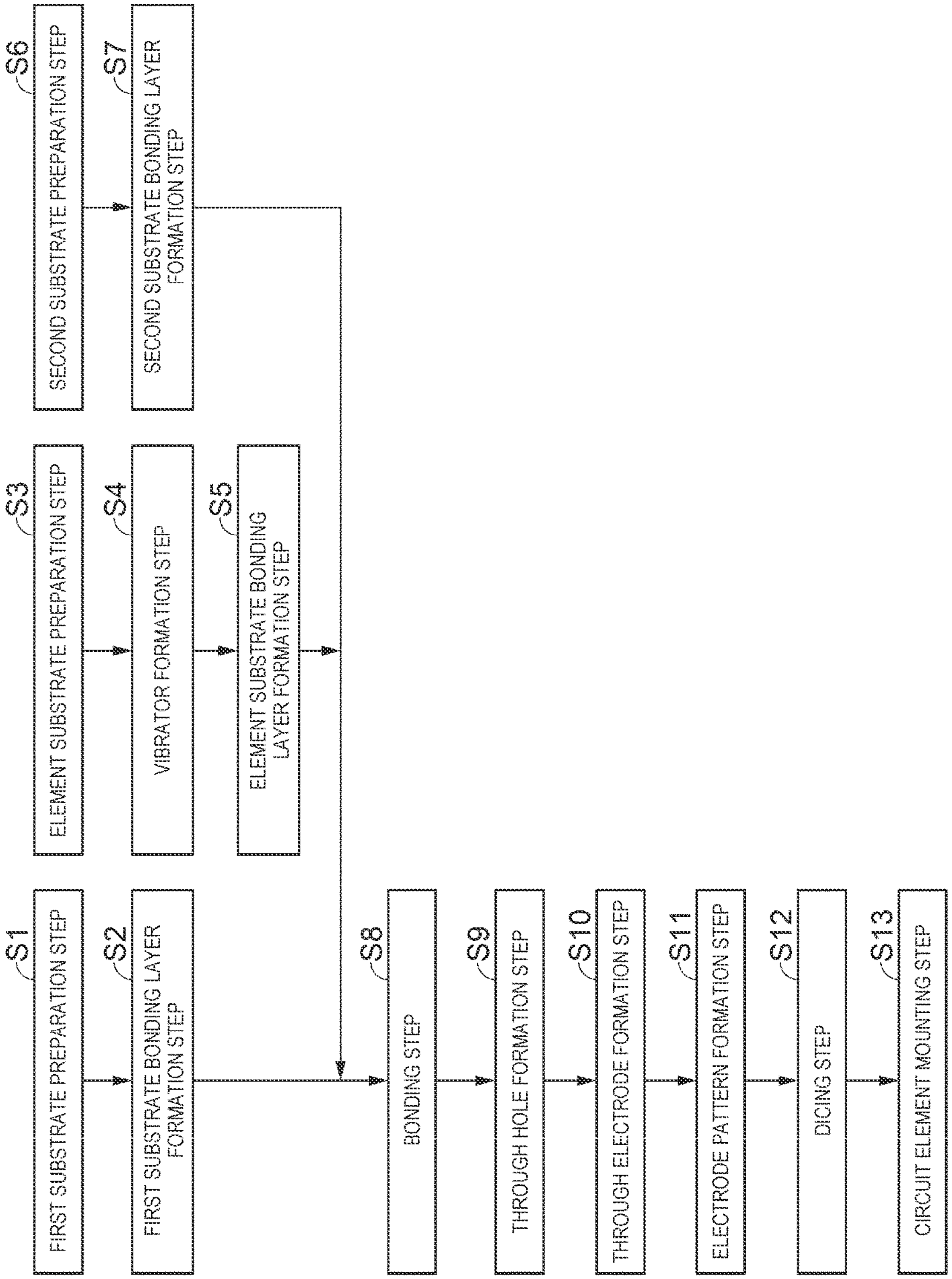

FIG. 7
S1
FIRST SUBSTRATE PREPARATION STEP
S2
FIRST SUBSTRATE BONDING LAYER FORMATION STEP
S3
ELEMENT SUBSTRATE PREPARATION STEP
S4
VIBRATOR FORMATION STEP
S5
ELEMENT SUBSTRATE BONDING LAYER FORMATION STEP
S6
SECOND SUBSTRATE PREPARATION STEP
S7
SECOND SUBSTRATE BONDING LAYER FORMATION STEP
S8
BONDING STEP
S9
THROUGH HOLE FORMATION STEP
S10
THROUGH ELECTRODE FORMATION STEP
S11
ELECTRODE PATTERN FORMATION STEP
S12
DICING STEP
S13
CIRCUIT ELEMENT MOUNTING STEP

FIG. 11
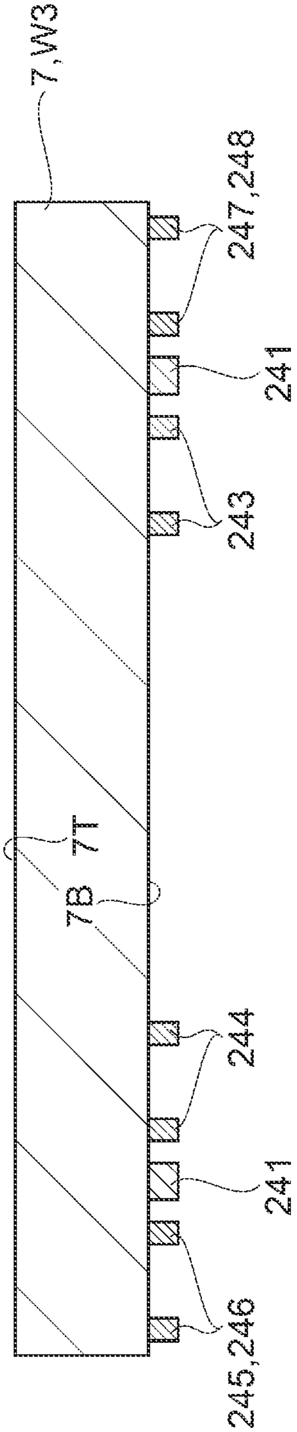
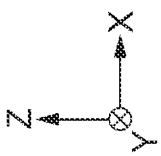

7,W3
3T
3,W2
3B
5,W1
47,48
41
31
37,38
43
13
11
15
S
21
23
7T
5T
7B
5B
87
17
13
44
34
41
31
45,46
35,36

X
Z
Y

7,W3
77,78
3T
3,W2
3B
5,W1
67,68
57,58
97,98
47,48
41
31
37,38
53
73
63
43
13
11
15
S
21
23
7T
5T
7B
5B
87
17
13
74
54
44
34
64
41
31
55,56
95,96
75,76
45,46
35,36
65,66

X
Z
Y

VIBRATOR DEVICE AND METHOD FOR MANUFACTURING VIBRATOR DEVICE

The present application is based on, and claims priority from JP Application Serial Number 2022-037854, filed on Mar. 11, 2022, the disclosure of which is hereby incorporated by reference herein in its entirety.

BACKGROUND

1. Technical Field

The present disclosure relates to a vibrator device and a method for manufacturing a vibrator device.

2. Related Art

JP-A-2019-161458 discloses a piezoelectric vibrator device including a package in which a first sealing member and a second sealing member are laminated and bonded via a piezoelectric vibration plate having a vibrator and an outer frame portion surrounding an outer periphery of the vibrator, and the vibrator is hermetically sealed in an internal space of the package, in which a through hole having a circular shape in a plan view is formed in the first sealing member, and the piezoelectric vibration plate and an IC chip mounted on a main surface at an opposite side of the first sealing member from a bonding surface to the piezoelectric vibration plate are electrically coupled by a through electrode formed along an inner wall surface of the through hole.

However, in the piezoelectric vibrator device disclosed in JP-A-2019-161458, a stress is generated in the through hole formed in the first sealing member due to an external force acting on the first sealing member during mounting of the IC chip or the like. Therefore, the stress may be locally concentrated in a portion of an outer shape of the through hole in the plan view, the portion being close to the internal space of the package, and the through hole may be easily broken.

SUMMARY

Provided is a vibrator device including: an element substrate including a frame portion having a first surface and a second surface at an opposite side from the first surface, and a vibrator element disposed inside the frame portion; a first substrate having a third surface on a first surface side and a fourth surface at an opposite side from the third surface, the first substrate being bonded to the first surface of the frame portion at the third surface; a second substrate having a fifth surface on a second surface side and a sixth surface at an opposite side from the fifth surface, the second substrate being bonded to the second surface of the frame portion at the fifth surface; and a cavity surrounded by the frame portion, the first substrate, and the second substrate. The second substrate includes a through electrode at a position overlapping the frame portion in a plan view. An outer shape of the through electrode in the sixth surface in the plan view includes a first portion and a second portion. The first portion is located at a position closer to the cavity than is the second portion. A curvature of the first portion is smaller than a curvature of the second portion.

Provided is a method for manufacturing a vibrator device including: an element substrate including a frame portion having a first surface and a second surface at an opposite side from the first surface, and a vibrator element disposed inside the frame portion; a first substrate having a third surface on a first surface side and a fourth surface at an opposite side from the third surface, the first substrate being bonded to the first surface of the frame portion at the third surface; a second substrate having a fifth surface on a second surface side and a sixth surface at an opposite side from the fifth surface, the second substrate being bonded to the second surface of the frame portion at the fifth surface; a circuit element disposed on the sixth surface of the second substrate; and a cavity surrounded by the frame portion, the first substrate, and the second substrate, in which the second substrate includes a through electrode at a position overlapping the frame portion in a plan view, an outer shape of the through electrode in the sixth surface in the plan view includes a first portion and a second portion, the first portion is located at a position closer to the cavity than is the second portion, and a curvature of the first portion is smaller than a curvature of the second portion. The method includes: a bonding step of bonding the element substrate and the first substrate to each other and bonding the element substrate and the second substrate to each other; a through hole formation step of subsequently forming a through hole penetrating the second substrate at a position of the second substrate overlapping the frame portion in the plan view; a through electrode formation step of forming the through electrode by forming a metal film on a side surface of the through hole or metal in the through hole; and a circuit element mounting step of mounting the circuit element on the sixth surface of the second substrate.

Provided is a method for manufacturing a vibrator device including: an element substrate including a frame portion having a first surface and a second surface at an opposite side from the first surface, and a vibrator element disposed inside the frame portion; a first substrate having a third surface on a first surface side and a fourth surface at an opposite side from the third surface, the first substrate being bonded to the first surface of the frame portion at the third surface; a second substrate having a fifth surface on a second surface side and a sixth surface at an opposite side from the fifth surface, the second substrate being bonded to the second surface of the frame portion at the fifth surface; and a circuit element disposed on the sixth surface of the second substrate, in which the second substrate includes a through electrode at a position overlapping the frame portion in a plan view. The method includes: a bonding step of bonding the element substrate and the first substrate to each other via a first bonding member made of metal, and bonding the element substrate and the second substrate to each other via a second bonding member made of metal; a through hole formation step of subsequently forming, by dry etching, a through hole penetrating the second substrate at a position of the second substrate overlapping the frame portion in the plan view; a through electrode formation step of forming the through electrode by forming a metal film on a side surface of the through hole or metal in the through hole; and a circuit element mounting step of mounting the circuit element on the sixth surface of the second substrate. In the bonding step, at least one of the first bonding member and the second bonding member surrounds the through hole with a gap between the first bonding member or the second bonding member and the through hole.

BRIEF DESCRIPTION OF THE DRAWINGS

FIG. 7 is a diagram showing steps of manufacturing the vibrator device according to the first embodiment.

FIG. 11 is a cross-sectional view showing the method for manufacturing the vibrator device.

DESCRIPTION OF EXEMPLARY EMBODIMENTS

Next, embodiments of the present disclosure will be described with reference to the drawings.

For convenience of description, each drawing except for FIG. 7 shows an X axis, a Y axis, and a Z axis as three axes orthogonal to one another. A direction along the X axis is referred to as an "X direction", a direction along the Y axis is referred to as a "Y direction", and a direction along the Z axis is referred to as a "Z direction". An arrow tip side in each axial direction is also referred to as a "plus side", and an arrow base end side is also referred to as a "minus side". For example, the Y direction refers to both a plus side in the Y direction and a minus side in the Y direction. A plus side in the Z direction is also referred to as "upper", and a minus side in the Z direction is also referred to as "lower". A plan view from the Z direction is also simply referred to as a "plan view".

Figure 16:
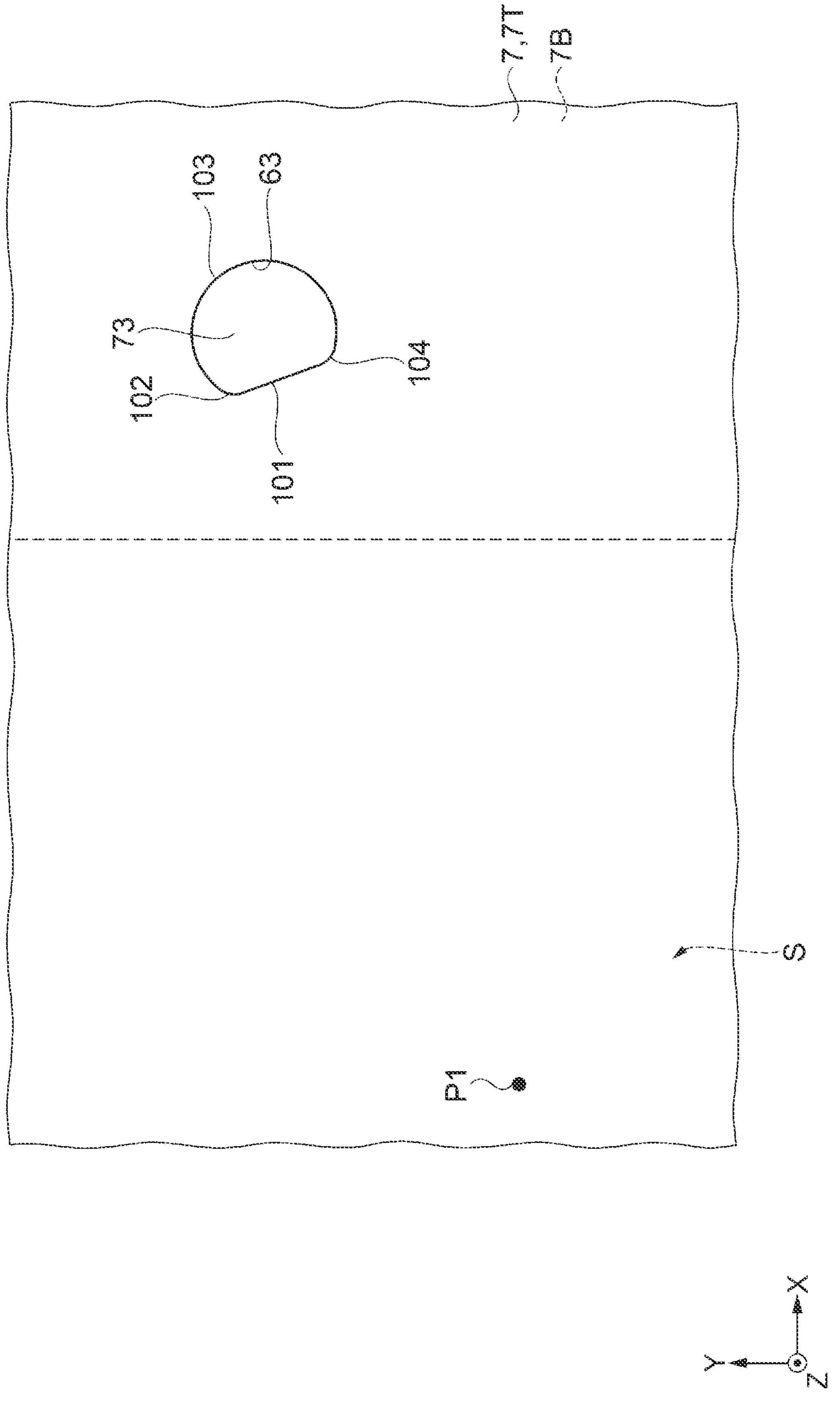
FIG. 16 is a plan view showing a through electrode of a vibrator device according to a second embodiment.
Figure 17:
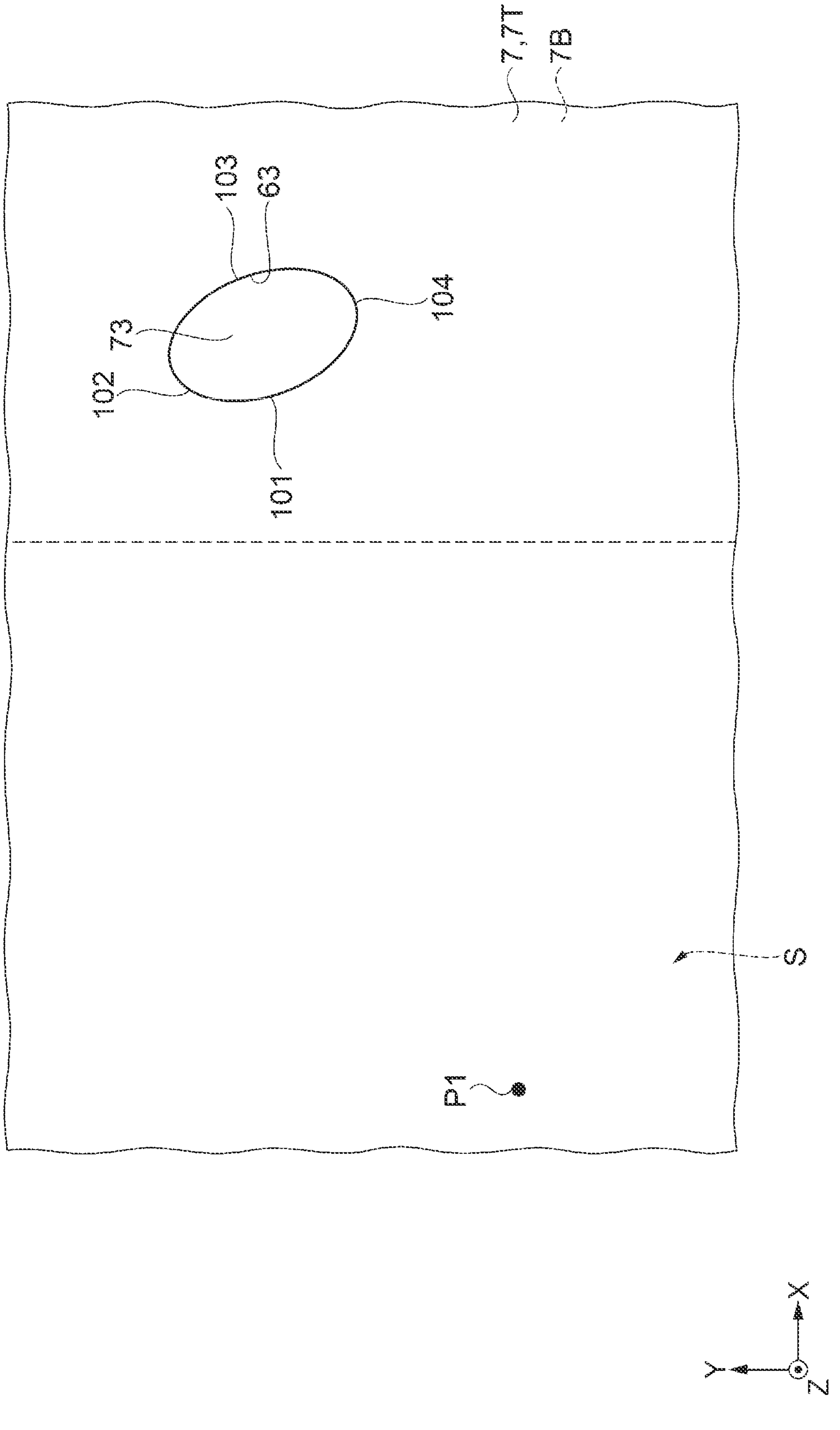
FIG. 17 is a plan view showing a through electrode of a vibrator device according to a third embodiment.

For convenience of description, a cavity S is indicated by a broken line in FIGS. 4, 5, 6, 16, and 17. In FIGS. 5, 6, 16, and 17, a circuit element 9, bonding members 59, and electrode patterns 53, 54, 55, 56, 57, 58 are not shown. FIGS. 16 and 17 are diagrams each showing a through electrode 73 as a representative example of a through electrode having an outer shape in the plan view different from that according to the first embodiment, and are plan views each corresponding to a position of a portion D in FIG. 5.

1. First Embodiment

A vibrator device 1 according to a first embodiment will be described with reference to FIGS. 1 to 6. In the embodiment, the vibrator device 1 is an oscillator. The vibrator device 1 may not be an oscillator. For example, the vibrator device 1 may be an inertial sensor.

First, a basic structure of the vibrator device 1 will be described.

Figure 1:
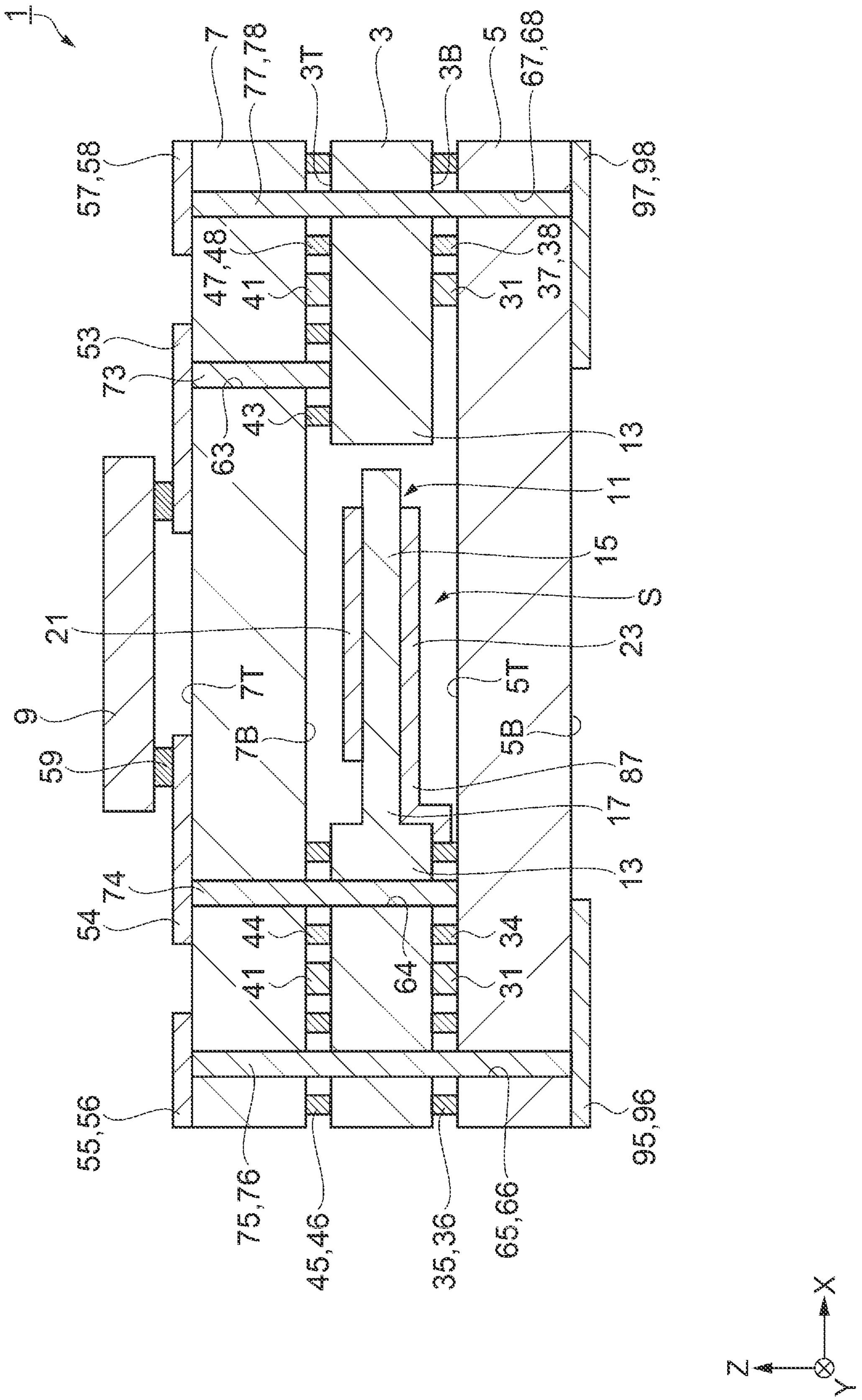
FIG. 1 is a schematic cross-sectional view of a vibrator device according to a first embodiment.

As shown in FIG. 1, the vibrator device 1 includes an element substrate 3, a first substrate 5, a second substrate 7, and the circuit element 9. The element substrate 3 includes a vibrator element 11. The vibrator element 11 will be described later.

The element substrate 3 is disposed above the first substrate 5 as a base substrate. The second substrate 7 as a lid substrate is disposed above the element substrate 3. The circuit element 9 is disposed above the second substrate 7.

The element substrate 3 and the first substrate 5 are bonded to each other, and the element substrate 3 and the second substrate 7 are bonded to each other, thereby forming a package having the cavity S for accommodating the vibrator element 11. The cavity S is an internal space of the package.

The element substrate 3 is a quartz crystal substrate. In the embodiment, the element substrate 3 is an AT cut quartz crystal substrate. The element substrate 3 is not limited to the AT cut quartz crystal substrate, and may be a quartz crystal substrate having other cut angles, such as Z-cut, SC-cut, ST-cut, or BT-cut.

The first substrate 5 and the second substrate 7 are quartz crystal substrates. When the first substrate 5 and the second substrate 7 are formed of quartz crystal substrates in the same manner as the element substrate 3, thermal expansion coefficients of the element substrate 3, the first substrate 5, and the second substrate 7 can be substantially equal to one another. Therefore, a thermal stress due to a difference in thermal expansion coefficient among the element substrate 3, the first substrate 5, and the second substrate 7 is less likely to occur, and the vibrator element 11 is less likely to be subjected to the stress.

In the embodiment, the first substrate 5 and the second substrate 7 are AT cut quartz crystal substrates having the same cut angle as that of the element substrate 3. Further, crystal axis directions of the first substrate 5 and the second substrate 7 coincide with a crystal axis direction of the element substrate 3. In this manner, the first substrate 5, the second substrate 7, and the element substrate 3 have the same cut angle, and crystal axis directions thereof are aligned with one another, whereby the thermal stress due to the difference in thermal expansion coefficient among the element substrate 3, the first substrate 5, and the second substrate 7 is less likely to occur, and the vibrator element 11 is further less likely to be subjected to the stress.

At least one of the first substrate 5 and the second substrate 7 may be a quartz crystal substrate having a cut angle different from that of the element substrate 3, or at least one of the first substrate 5 and the second substrate 7 may be a quartz crystal substrate having the same cut angle as that of the element substrate 3 and a crystal axis direction that does not coincide with that of the element substrate 3.

The first substrate 5 and the second substrate 7 may be made of materials other than quartz crystal. For example, the first substrate 5 and the second substrate 7 may be glass substrates made of soda-lime glass or quartz glass.

Figure 2:
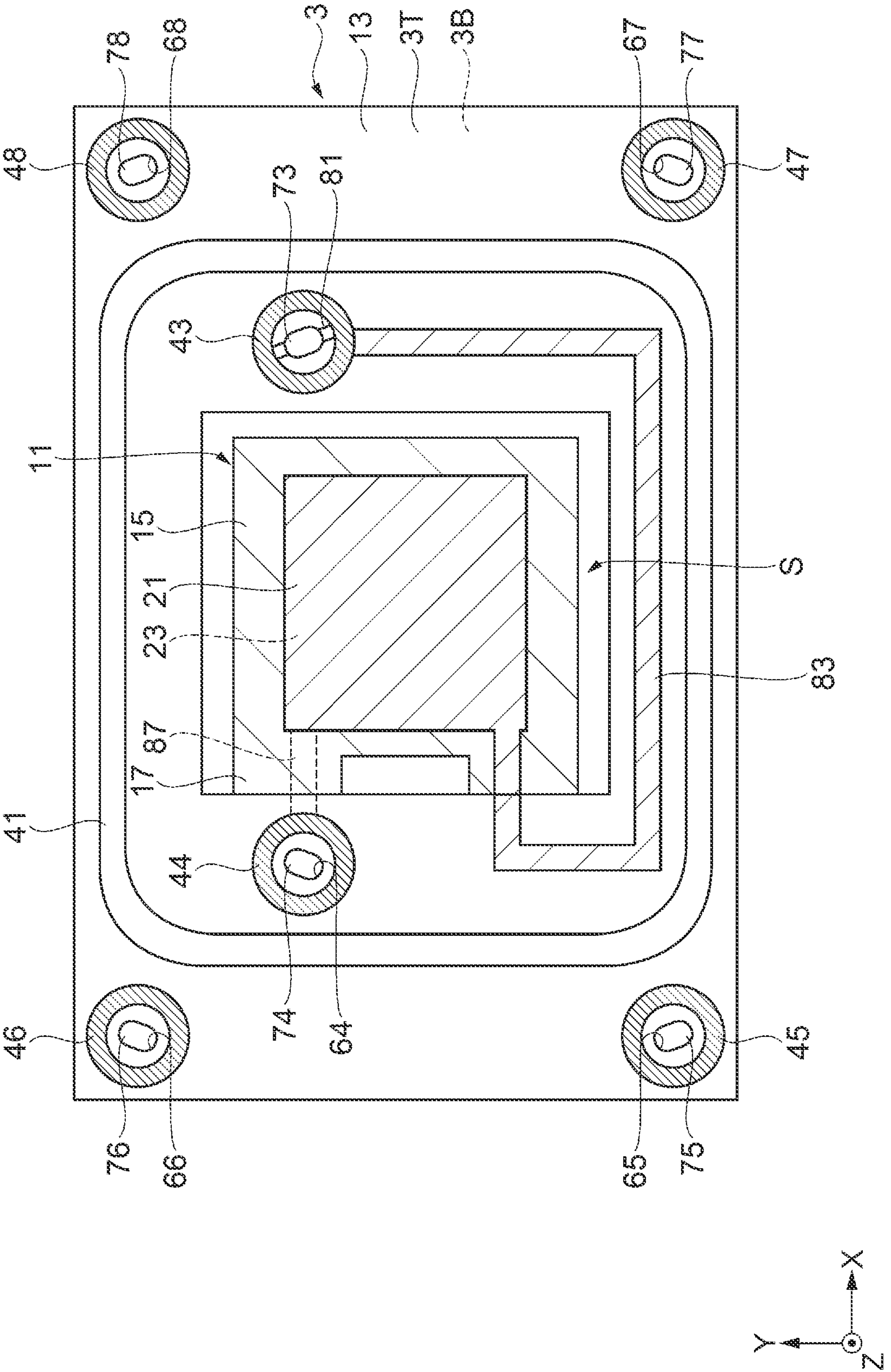
FIG. 2 is a plan view of an element substrate shown in FIG. 1.

As shown in FIGS. 1 and 2, the element substrate 3 includes a frame-shaped frame portion 13, a vibrator 15 disposed inside the frame portion 13, and a pair of coupling portions 17 coupling the frame portion 13 and the vibrator 15.

The frame portion 13 includes a first surface 3B and a second surface 3T at an opposite side of the frame portion 13 from the first surface 3B. The first surface 3B is a lower surface of the frame portion 13, and the second surface 3T is an upper surface of the frame portion 13.

A thickness of the vibrator 15 in the Z direction is smaller than that of the frame portion 13, an upper surface of the vibrator 15 is located on a minus side in the Z direction with respect to the second surface 3T of the frame portion 13, and a lower surface of the vibrator 15 is located on a plus side in the Z direction with respect to the first surface 3B of the frame portion 13. Accordingly, it is possible to prevent contact between the vibrator 15 and the first substrate 5, and between the vibrator 15 and the second substrate 7.

A first excitation electrode 21 is disposed on the upper surface of the vibrator 15. A second excitation electrode 23 is disposed on the lower surface of the vibrator 15. In this manner, the vibrator 15, the first excitation electrode 21, and the second excitation electrode 23 constitute the vibrator element 11. Since the vibrator 15 is disposed inside the frame portion 13, the vibrator element 11 is also disposed inside the frame portion 13.

Figure 3:
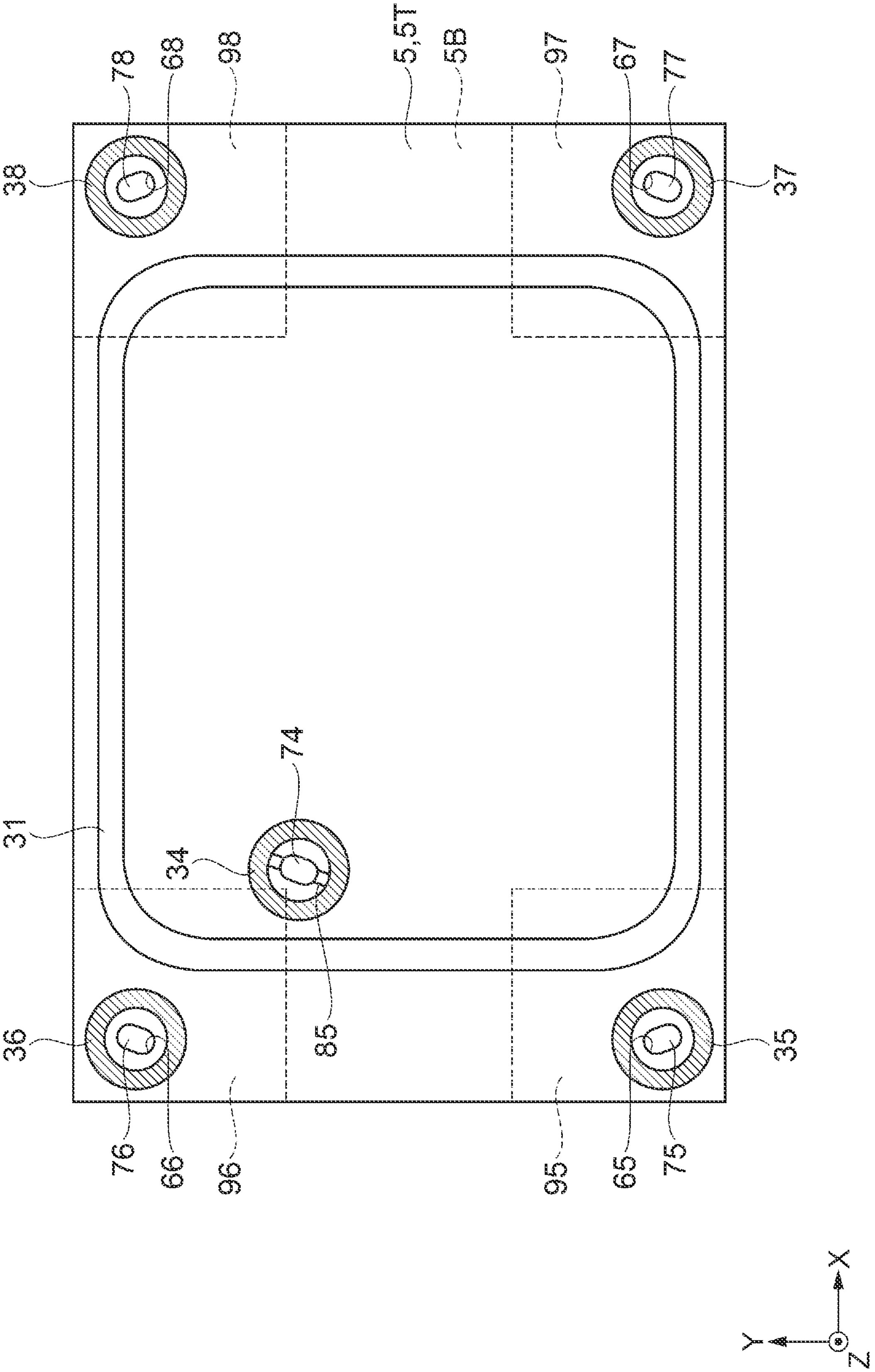
FIG. 3 is a plan view of a first substrate shown in FIG. 1.

As shown in FIGS. 1 and 3, the first substrate 5 includes a third surface 5T that is an upper surface and a fourth surface 5B that is a lower surface. In other words, the first substrate 5 includes the third surface 5T on a first surface 3B side and the fourth surface 5B at an opposite side of the first substrate 5 from the third surface 5T.

A first sealing bonding member 31 and a plurality of first bonding members 34, 35, 36, 37, 38 are disposed between the third surface 5T of the first substrate 5 and the first surface 3B of the element substrate 3. The first substrate 5 and the element substrate 3 are bonded to each other via the first sealing bonding member 31 and the plurality of first bonding members 34, 35, 36, 37, 38.

The first sealing bonding member 31 has an annular shape in the plan view. The first sealing bonding member 31 surrounds the vibrator element 11 in the plan view.

Figure 4:
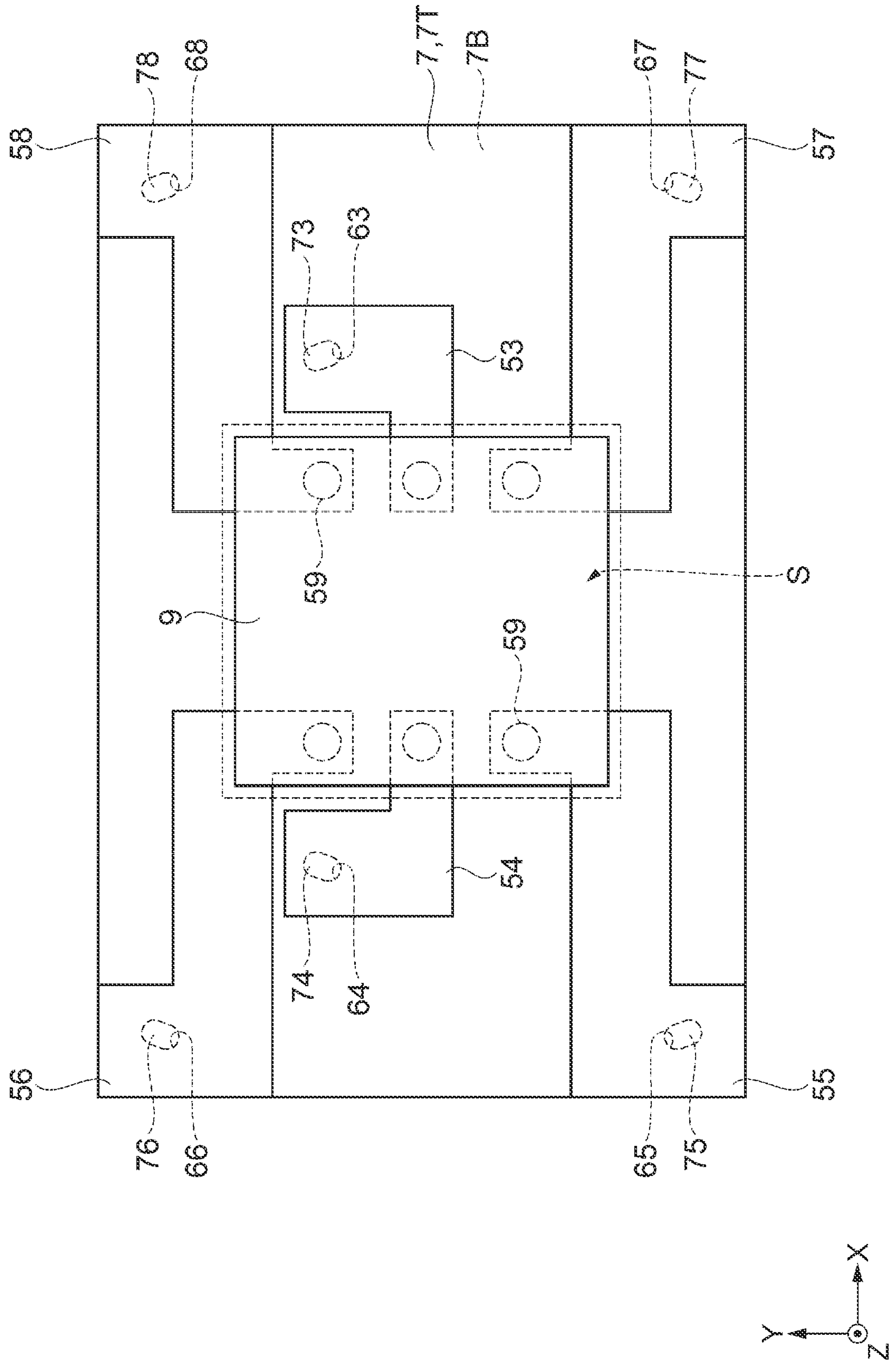
FIG. 4 is a plan view of a second substrate shown in FIG. 1.

As shown in FIGS. 1 and 4, the second substrate 7 includes a fifth surface 7B that is a lower surface and a sixth surface 7T that is an upper surface. In other words, the second substrate 7 includes the fifth surface 7B on a second surface 3T side and the sixth surface 7T at an opposite side of the second substrate 7 from the fifth surface 7B.

As shown in FIGS. 1 and 2, a second sealing bonding member 41 and a plurality of second bonding members 43, 44, 45, 46, 47, 48 are disposed between the fifth surface 7B of the second substrate 7 and the second surface 3T of the element substrate 3. The second substrate 7 and the element substrate 3 are bonded to each other via the second sealing bonding member 41 and the plurality of second bonding members 43, 44, 45, 46, 47, 48.

The second sealing bonding member 41 has an annular shape in the plan view. The second sealing bonding member 41 surrounds the vibrator element 11 in the plan view.

The third surface 5T of the first substrate 5 and the first surface 3B of the element substrate 3 are bonded to each other via the first sealing bonding member 31, and the fifth surface 7B of the second substrate 7 and the second surface 3T of the element substrate 3 are bonded to each other via the second sealing bonding member 41, whereby the cavity S for accommodating the vibrator element 11 is formed. The cavity S is an airtight space surrounded by the first substrate 5, the frame portion 13 of the element substrate 3, and the second substrate 7. An outer shape of the cavity S in the plan view is the same as an outer shape of an inner wall surface of the frame portion 13 in the plan view. In other words, a peripheral edge portion of the cavity S is the same as the inner wall surface of the frame portion 13 in the plan view.

In the embodiment, the cavity S accommodating the vibrator element 11 is in a depressurized state. An atmosphere in the cavity S is not particularly limited, and may be, for example, an atmosphere in which an inert gas such as nitrogen or argon is sealed, or may be in an atmospheric pressure state or a pressurized state instead of the depressurized state. Vibration characteristics of the vibrator element 11 can be improved by bringing the cavity S into the depressurized state.

As shown in FIGS. 1 and 4, the circuit element 9 is disposed on the sixth surface 7T of the second substrate 7. The circuit element 9 includes an oscillation circuit that oscillates the vibrator element 11. The circuit element 9 is an integrated circuit (IC) chip.

A plurality of electrode patterns 53, 54, 55, 56, 57, 58 electrically coupled to the circuit element 9 are disposed on the sixth surface 7T of the second substrate 7.

The circuit element 9 is bonded to the electrode patterns 53, 54, 55, 56, 57, 58 via the conductive bonding members 59. The bonding member 59 is, for example, a metal bump made of gold or copper.

In the embodiment, the bonding member 59 is disposed at a position overlapping the cavity S in the plan view. That is, the bonding member 59 is disposed inside the frame portion 13 in the plan view.

A plurality of through holes 63, 64, 65, 66, 67, 68 are formed in the second substrate 7 at positions overlapping the frame portion 13 in the plan view.

The through hole 63 penetrates between the sixth surface 7T and the fifth surface 7B of the second substrate 7.

The through hole 64 penetrates between the sixth surface 7T and the fifth surface 7B of the second substrate 7, and further penetrates between the first surface 3B and the second surface 3T of the frame portion 13.

The through holes 65, 66, 67, 68 penetrate between the sixth surface 7T and the fifth surface 7B of the second substrate 7 and further penetrate between the first surface 3B and the second surface 3T of the frame portion 13 and between the third surface 5T and the fourth surface 5B of the first substrate 5.

That is, as shown in FIGS. 1 and 2, the through holes 64, 65, 66, 67, 68 are formed in the frame portion 13 of the element substrate 3. As shown in FIGS. 1 and 3, the through holes 65, 66, 67, 68 are formed in the first substrate 5 at positions overlapping the frame portion 13 in the plan view.

As shown in FIGS. 1 and 4, the through holes 63, 64 are formed inside the first sealing bonding member 31 and the second sealing bonding member 41 in the plan view. The through holes 65, 66, 67, 68 are formed outside the first sealing bonding member 31 and the second sealing bonding member 41 in the plan view. The through holes 63, 64 are formed at positions closer to the cavity S than are the through holes 65, 66, 67, 68.

Through electrodes 73, 74, 75, 76, 77, 78 are formed in the through holes 63, 64, 65, 66, 67, 68, respectively. As described above, since the through holes 63, 64, 65, 66, 67, 68 are formed at positions overlapping the frame portion 13 in the plan view, the through electrodes 73, 74, 75, 76, 77, 78 are also formed at positions overlapping the frame portion 13 in the plan view.

In the embodiment, the through electrodes 73, 74, 75, 76, 77, 78 are formed by forming metal such as copper in the through holes 63, 64, 65, 66, 67, 68 and filling the through holes 63, 64, 65, 66, 67, 68 with the metal. The through electrodes 73, 74, 75, 76, 77, 78 are not limited thereto. For example, the through electrodes 73, 74, 75, 76, 77, 78 may be formed by forming a metal film on side surfaces, that is, inner wall surfaces of the through holes 63, 64, 65, 66, 67, 68. That is, the through electrodes 73, 74, 75, 76, 77, 78 may be hollow.

By filling the through holes 63, 64, 65, 66, 67, 68 with the metal or by forming the metal film on the side surfaces of the through holes 63, 64, 65, 66, 67, 68, outer shapes of the through electrodes 73, 74, 75, 76, 77, 78 in the plan view are the same as outer shapes of the through holes 63, 64, 65, 66, 67, 68 in the plan view, respectively.

As shown in FIGS. 1 and 2, the through electrode 73 electrically couples the second substrate 7 and the element substrate 3.

An upper end of the through electrode 73 is located on the sixth surface 7T of the second substrate 7. The through electrode 73 is electrically coupled to the electrode pattern 53 disposed on the sixth surface 7T.

A lower end of the through electrode 73 is located on the second surface 3T of the element substrate 3. The through electrode 73 is electrically coupled to a wiring 81 disposed on the second surface 3T.

The wiring 81 is electrically coupled to the second bonding member 43. A thickness of the wiring 81 in the Z direction is smaller than that of the second bonding member 43, and an upper surface of the wiring 81 is located on a minus side in the Z direction with respect to an upper surface of the second bonding member 43. That is, the upper surface of the wiring 81 and the fifth surface 7B of the second substrate 7 are spaced apart from each other.

The second bonding member 43 is electrically coupled to a leading-out wiring 83 disposed on the second surface 3T of the element substrate 3. The leading-out wiring 83 is a wiring that electrically couples the second bonding member 43 and the first excitation electrode 21.

In this manner, the circuit element 9 and the first excitation electrode 21 are electrically coupled to each other via the bonding members 59, the electrode pattern 53, the through electrode 73, the wiring 81, the second bonding member 43, and the leading-out wiring 83.

As shown in FIGS. 1, 2, and 3, the through electrode 74 electrically couples the second substrate 7 and the element substrate 3.

An upper end of the through electrode 74 is located on the sixth surface 7T of the second substrate 7. The through electrode 74 is electrically coupled to the electrode pattern 54 disposed on the sixth surface 7T.

A lower end of the through electrode 74 is located on the third surface 5T of the first substrate 5. The through electrode 74 is electrically coupled to a wiring 85 disposed on the third surface 5T.

The wiring 85 is electrically coupled to the first bonding member 34. A thickness of the wiring 85 in the Z direction is smaller than that of the first bonding member 34, and an upper surface of the wiring 85 is located on a minus side in the Z direction with respect to an upper surface of the first bonding member 34. That is, the upper surface of the wiring 85 and the first surface 3B of the element substrate 3 are spaced apart from each other.

The first bonding member 34 is electrically coupled to a leading-out wiring 87 disposed on the first surface 3B of the element substrate 3. The leading-out wiring 87 is a wiring that electrically couples the first bonding member 34 and the second excitation electrode 23.

In this manner, the circuit element 9 and the second excitation electrode 23 are electrically coupled to each other via the bonding members 59, the electrode pattern 54, the through electrode 74, the wiring 85, the first bonding member 34, and the leading-out wiring 87.

As shown in FIGS. 1, 3, and 4, the through electrodes 75, 76, 77, 78 electrically couple the second substrate 7 and the first substrate 5.

Upper ends of the through electrodes 75, 76, 77, 78 are located on the sixth surface 7T of the second substrate 7. The through electrodes 75, 76, 77, 78 are electrically coupled to the electrode patterns 55, 56, 57, 58 disposed on the sixth surface 7T, respectively.

Lower ends of the through electrodes 75, 76, 77, 78 are located on the fourth surface 5B of the first substrate 5. The through electrodes 75, 76, 77, 78 are electrically coupled to external terminals 95, 96, 97, 98 disposed on the fourth surface 5B, respectively.

The basic structure of the vibrator device 1 has been described above.

Next, the outer shapes of the through electrodes 73, 74, 75, 76, 77, 78 in the plan view will be described.

As described above, in the embodiment, the outer shapes of the through electrodes 73, 74, 75, 76, 77, 78 in the plan view are the same as the outer shapes of the through holes 63, 64, 65, 66, 67, 68 in the plan view. Therefore, the outer shapes of the through electrodes 73, 74, 75, 76, 77, 78 in the plan view may be appropriately read as the outer shapes of the through holes 63, 64, 65, 66, 67, 68 in the plan view, in which the through electrodes 73, 74, 75, 76, 77, 78 are respectively formed. Alternatively, the outer shapes of the through holes 63, 64, 65, 66, 67, 68 in the plan view may be read as the outer shapes of the through electrodes 73, 74, 75, 76, 77, 78 in the plan view, respectively.

In the vibrator device 1 having the above-described structure, a stress is generated in the through holes 63, 64, 65, 66, 67, 68 formed in the second substrate 7, for example, when the circuit element 9 is mounted on the sixth surface 7T of the second substrate 7. For example, the stress is generated by the principle of leverage with a region of the second substrate 7 where the circuit element 9 is bonded as a point of effort, a peripheral edge portion of the cavity S as a fulcrum, and the through holes 63, 64, 65, 66, 67, 68 as points of load. In this case, the stress is particularly large in the through hole 63 or the through hole 64 formed at a position close to the fulcrum. In other words, the stress is particularly large in the through hole 63 or the through hole 64 formed at the position close to the cavity S in the plan view.

Therefore, in the embodiment, among the through electrodes 73, 74, 75, 76, 77, 78 respectively formed in the through holes 63, 64, 65, 66, 67, 68, the through electrode 73 formed in the through hole 63 will be described as a representative example.

Figure 5:
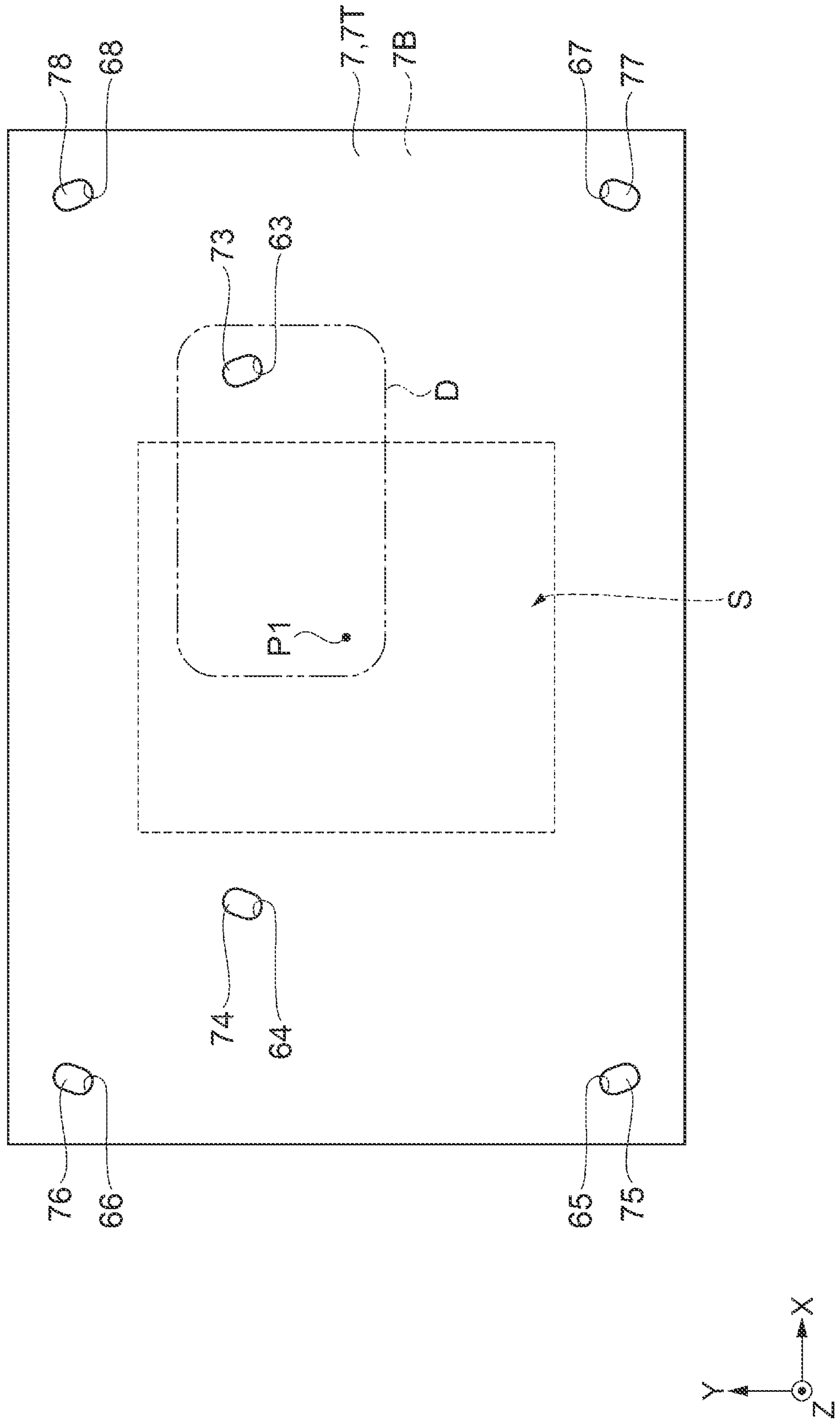
FIG. 5 is a plan view showing through electrodes shown in FIG. 4.

As shown in FIGS. 4 and 5, the through hole 63 and the through electrode 73 are disposed on a plus side in the X direction with respect to the cavity S in the plan view.

Figure 6:
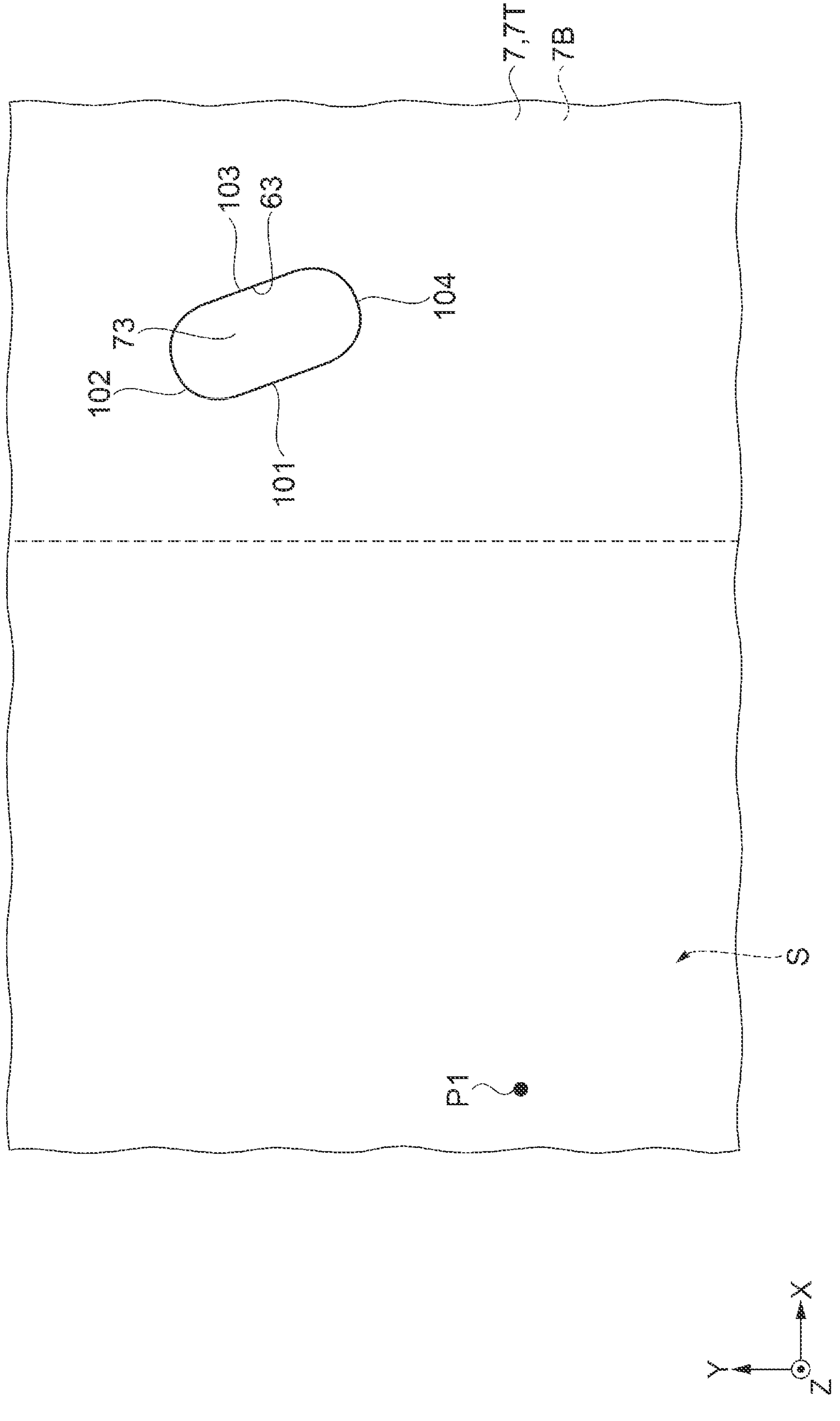
FIG. 6 is a plan view corresponding to a position of a portion D in FIG. 5.

As shown in FIGS. 5 and 6, the outer shape of the through electrode 73 in the sixth surface 7T in the plan view is a track shape.

The track shape is also referred to as an oval shape. The track shape is a shape formed by two linear portions and two curved portions. Specifically, the track shape is a shape formed by two parallel linear portions, an arc that is a curved portion disposed on one end side of the two linear portions, and an arc that is a curved portion disposed on the other end side of the two linear portions. The arc includes a circular arc, and may not be a circular arc.

The outer shape of the through electrode 73 in the plan view includes a first portion 101, a second portion 102, a third portion 103, and a fourth portion 104.

The first portion 101 is one of the two linear portions constituting the track shape.

The first portion 101 faces a center P1 of the cavity S in the plan view. Specifically, the first portion 101 is disposed such that a direction along a normal line of the linear portion, which is the first portion 101, faces a center P1 side of the cavity S.

The second portion 102 is one of the two curved portions constituting the track shape. The second portion 102 has a semicircular shape. The second portion 102 is convex toward the plus side in the Y direction. An end portion of the second portion 102 on a minus side in the X direction is coupled to an end portion of the first portion 101 on the plus side in the Y direction.

The third portion 103 is the other linear portion of the two linear portions constituting the track shape. The third portion 103 is disposed on the plus side in the X direction with respect to the first portion 101 in the plan view. That is, the third portion 103 is disposed opposite from the center P1 of the cavity S with the first portion 101 interposed therebetween. An end portion of the third portion 103 on the plus side in the Y direction is coupled to an end portion of the second portion 102 on the plus side in the X direction.

The fourth portion 104 is the other curved portion of the two curved portions constituting the track shape. The fourth portion 104 has a semicircular shape. The fourth portion 104 is convex toward the minus side in the Y direction. An end portion of the fourth portion 104 on the minus side in the X direction is coupled to an end portion of the first portion 101 on the minus side in the Y direction. An end portion of the fourth portion 104 on the plus side in the X direction is coupled to an end portion of the third portion 103 on the minus side in the Y direction.

The fourth portion 104 may be read as the second portion 102, and the second portion 102 may be read as the fourth portion 104.

By disposing the first portion 101, the second portion 102, and the fourth portion 104 in this manner, the first portion 101 is disposed at a position closer to the cavity S than are the second portion 102 and the fourth portion 104 when viewed from the center P1 side of the cavity S. In other words, in the outer shape of the through electrode 73 in the sixth surface 7T in the plan view, a portion closest to the cavity S when viewed from the center P1 side of the cavity S is the first portion 101.

The first portion 101 is the linear portion, and a curvature C1 of the first portion 101 is 0.

The second portion 102 and the fourth portion 104 each have the semicircular shape, and each of curvatures C2, C4 of the second portion 102 and the fourth portion 104 is a reciprocal of a radius of the semicircular shape. That is, each of the curvatures C2, C4 of the second portion 102 and the fourth portion 104 is larger than 0. In other words, the curvature C1 of the first portion 101 is smaller than each of the curvatures C2, C4 of the second portion 102 and the fourth portion 104.

In this manner, the outer shape of the through electrode 73 in the sixth surface 7T in the plan view includes the first portion 101 and the second portion 102, the first portion 101 is located at the position closer to the cavity S than is the second portion 102 when viewed from the center P1 side of the cavity S, and the curvature C1 of the first portion 101 is smaller than the curvature C2 of the second portion 102.

Accordingly, concentration of the stress in the first portion 101, which is the portion close to the cavity S, of the outer shape of the through electrode 73 in the plan view is reduced, and breakage of the through hole 63 and the second substrate 7 and airtightness failure of the cavity S can be prevented.

The third portion 103 is disposed at a position farther from the cavity S than are the second portion 102 and the fourth portion 104 when viewed from the center P1 side of the cavity S. In other words, in the outer shape of the through electrode 73 in the sixth surface 7T in the plan view, a portion farthest from the cavity S when viewed from the center P1 side of the cavity S is the third portion 103.

In the third portion 103 disposed at the position far from the cavity S, similarly to the first portion 101, concentration of the stress due to the principle of leverage with the region of the second substrate 7 where the circuit element 9 is bonded as the point of effort is also likely to occur.

In the embodiment, the third portion 103 is the linear portion, and the curvature C3 of the third portion 103 is 0.

In this manner, the outer shape of the through electrode 73 in the sixth surface 7T in the plan view includes the third portion 103, the third portion 103 is located at the position farther from the cavity S than is the second portion 102 when viewed from the center P1 side of the cavity S, and the curvature C3 of the third portion 103 is smaller than each of the curvatures C2, C4 of the second portion 102 and the fourth portion 104.

Accordingly, concentration of the stress in the third portion 103, which is the portion far from the cavity S, of the outer shape of the through electrode 73 in the plan view is reduced, and breakage of the through hole 63 and the second substrate 7 and airtightness failure of the cavity S can be further prevented.

In the embodiment, as described above, the first portion 101 and the third portion 103 are the linear portions.

Accordingly, compared to a case where the first portion 101 and the third portion 103 are curved portions, concentration of the stress on the first portion 101 and the third portion 103 is reduced, and breakage of the through hole 63 and the second substrate 7 and airtightness failure of the cavity S can be prevented.

In the embodiment, the second portion 102 and the fourth portion 104 are the curved portions. The first portion 101, the second portion 102, the third portion 103, and the fourth portion 104 are continuously coupled such that no corner portion is formed.

In other words, the outer shape of the through electrode 73 in the sixth surface 7T in the plan view is a mathematically smooth closed curve. The mathematically smooth closed curve means a curve that is continuously differentiable over the entire region of the closed curve. Alternatively, the mathematically smooth closed curve means a curve whose curvature can be defined over the entire region of the closed curve. A part of the mathematically smooth closed curve may be a straight line.

Accordingly, since the outer shape of the through electrode 73 in the sixth surface 7T in the plan view includes no corner portion where concentration of the stress is likely to occur, breakage of the through hole 63 and the second substrate 7 and airtightness failure of the cavity S can be prevented.

As described above, in the embodiment, the outer shape of the through electrode 73 in the plan view is the same as the outer shape of the through hole 63 in the plan view. In this manner, since the through electrode 73 and the through hole 63 in which the through electrode 73 is formed have the same outer shape in the plan view, even when a crack occurs in the through hole 63, propagation of the crack can be prevented.

Among the through electrodes 73, 74, 75, 76, 77, 78 respectively formed in the through holes 63, 64, 65, 66, 67, 68, the through electrode 73 formed in the through hole 63 has been described as the representative example.

As shown in FIGS. 4 and 5, for the through electrodes 74, 75, 76, 77, 78 respectively formed in the through holes 64, 65, 66, 67, 68, the same effect as that of the through electrode 73 can also be attained by the outer shape of each of the through electrodes 74, 75, 76, 77, 78 in the sixth surface 7T in the plan view being the same as the outer shape of the through electrode 73 in the plan view.

The outer shape of the through electrode 73 in the plan view according to the embodiment is preferably applied to all the through electrodes included in the vibrator device 1, but is not limited to being applied to all the through electrodes. For example, the outer shape may be applied only to a through electrode formed at a position where the stress generated in the through hole is particularly large, that is, at a position close to the cavity S. Specifically, the outer shape of the through electrode 73 in the plan view according to the embodiment may be applied to one of the through electrode 73 and the through electrode 74 formed at a position close to the cavity S, or both the through electrode 73 and the through electrode 74, and may not be applied to the through electrodes 75, 76, 77, 78 formed at positions far from the cavity S.

The outer shapes of the through electrodes 73, 74, 75, 76, 77, 78 in the plan view have been described above.

Next, the first bonding members 34, 35, 36, 37, 38 and the second bonding members 43, 44, 45, 46, 47, 48 will be described.

As described above, the stress generated by the principle of leverage with the region of the second substrate 7 where the circuit element 9 is bonded as the point of effort is particularly large in the through hole 63 or the through hole 64 formed at the position close to the cavity S in the plan view.

The first bonding member 34 and the second bonding member 44 surround the through electrode 74 formed in the through hole 64 with a gap between the first bonding member 34 or the second bonding member 44 and the through electrode 74.

Therefore, in the embodiment, among the first bonding members 34, 35, 36, 37, 38 and the second bonding members 43, 44, 45, 46, 47, 48, the first bonding member 34 and the second bonding member 44 will be described as representative examples.

As shown in FIGS. 2 and 3, the first bonding member 34 and the second bonding member 44 each have the annular shape in the plan view.

The first bonding member 34 and the second bonding member 44 are disposed with the gap between the first bonding member 34 or the second bonding member 44, and the through electrode 74 in the plan view. The first bonding member 34 and the second bonding member 44 surround the through electrode 74 in the plan view.

The second bonding member 44 surrounds the through electrode 74 with the gap between the second bonding member 44 and the through electrode 74. Accordingly, a bending moment generated with the region of the second substrate 7 where the circuit element 9 is bonded as the point of effort is less likely to be transmitted to the through hole 64. Therefore, breakage of the through hole 64 and the second substrate 7 and airtightness failure of the cavity S can be prevented.

The first bonding member 34 surrounds the through electrode 74 with the gap between the first bonding member 34 and the through electrode 74. Accordingly, a bending moment generated with the region of the second substrate 7 where the circuit element 9 is bonded as the point of effort is less likely to be transmitted to the through hole 64. Therefore, breakage of the through hole 64 and airtightness failure of the cavity S can be prevented.

Among the first bonding members 34, 35, 36, 37, 38 and the second bonding members 43, 44, 45, 46, 47, 48, the first bonding member 34 and the second bonding member 44 have been described above as the representative examples.

Similarly to the second bonding member 44, the second bonding members 43, 45, 46, 47, 48 each have an annular shape in the plan view, and surround the through electrodes 73, 75, 76, 77, 78 with gaps between the second bonding members 43, 45, 46, 47, 48 and the through electrodes 73, 75, 76, 77, 78, respectively. Accordingly, the same effect as that of the second bonding member 44 can be attained.

Similarly to the first bonding member 34, the first bonding members 35, 36, 37, 38 each have an annular shape in the plan view, and surround the through electrodes 75, 76, 77, 78 with gaps between the first bonding members 35, 36, 37, 38 and the through electrodes 75, 76, 77, 78, respectively. Accordingly, the same effect as that of the first bonding member 34 can be attained.

In the embodiment, the first bonding member 34 and the second bonding member 44 surround the through electrode 74 with the gap between the first bonding member 34 or the second bonding member 44 and the through electrode 74, and such an arrangement is applied to all the first bonding members and all the second bonding members. Such an arrangement is preferably applied to all the first bonding members and all the second bonding members, but is not limited to being applied to all the first bonding members and all the second bonding members. For example, the second bonding member 44 may surround the through electrode 74 with a gap between the second bonding member 44 and the through electrode 74, and the first bonding member 34 may be disposed without a gap between the first bonding member 34 and the through electrode 74. In other words, at least one of the first bonding members 34, 35, 36, 37, 38 and the second bonding members 43, 44, 45, 46, 47, 48 may surround the through electrodes 73, 74, 75, 76, 77, 78 with gaps between the one and the through electrodes 73, 74, 75, 76, 77, 78, respectively.

Next, a method for manufacturing the vibrator device 1 according to the first embodiment will be described with reference to FIGS. 7 to 15.

As shown in FIG. 7, the method for manufacturing the vibrator device 1 includes a first substrate preparation step S1 of preparing a quartz crystal substrate serving as a base material of the first substrate 5, a first substrate bonding layer formation step S2 of forming bonding layers on the first substrate 5, an element substrate preparation step S3 of preparing a quartz crystal substrate serving as a base material of the element substrate 3, a vibrator formation step S4 of forming the vibrator 15 on the element substrate 3, an element substrate bonding layer formation step S5 of forming bonding layers on the element substrate 3, a second substrate preparation step S6 of preparing a quartz crystal substrate serving as a base material of the second substrate 7, a second substrate bonding layer formation step S7 of forming bonding layers on the second substrate 7, a bonding step S8 of bonding the element substrate 3 and the first substrate 5 to each other and bonding the element substrate 3 and the second substrate 7 to each other, a through hole formation step S9 of forming the through holes 63, 64, 65, 66, 67, 68 in the second substrate 7, the element substrate 3, and the first substrate 5, a through electrode formation step S10 of forming the through electrodes 73, 74, 75, 76, 77, 78 respectively in the through holes, an electrode pattern formation step S11 of forming the electrode patterns 53, 54, 55, 56, 57, 58, a dicing step S12 of dicing a quartz crystal substrate into individual pieces each serving as a package of the vibrator device 1, and a circuit element mounting step S13 of mounting the circuit element 9 on the package of the vibrator device 1.

In the first substrate preparation step S1, a quartz crystal substrate W1 serving as a base material of the first substrate 5 is prepared. The quartz crystal substrate W1 is an AT cut quartz crystal substrate. A plurality of first substrates 5 are formed from the quartz crystal substrate W1. In the following, description and illustration will be made focusing on one first substrate 5 for convenience of description.

In the first substrate bonding layer formation step S2, bonding layers 131, 134, 135, 136, 137, 138 are formed on the first substrate 5.

Figure 8:
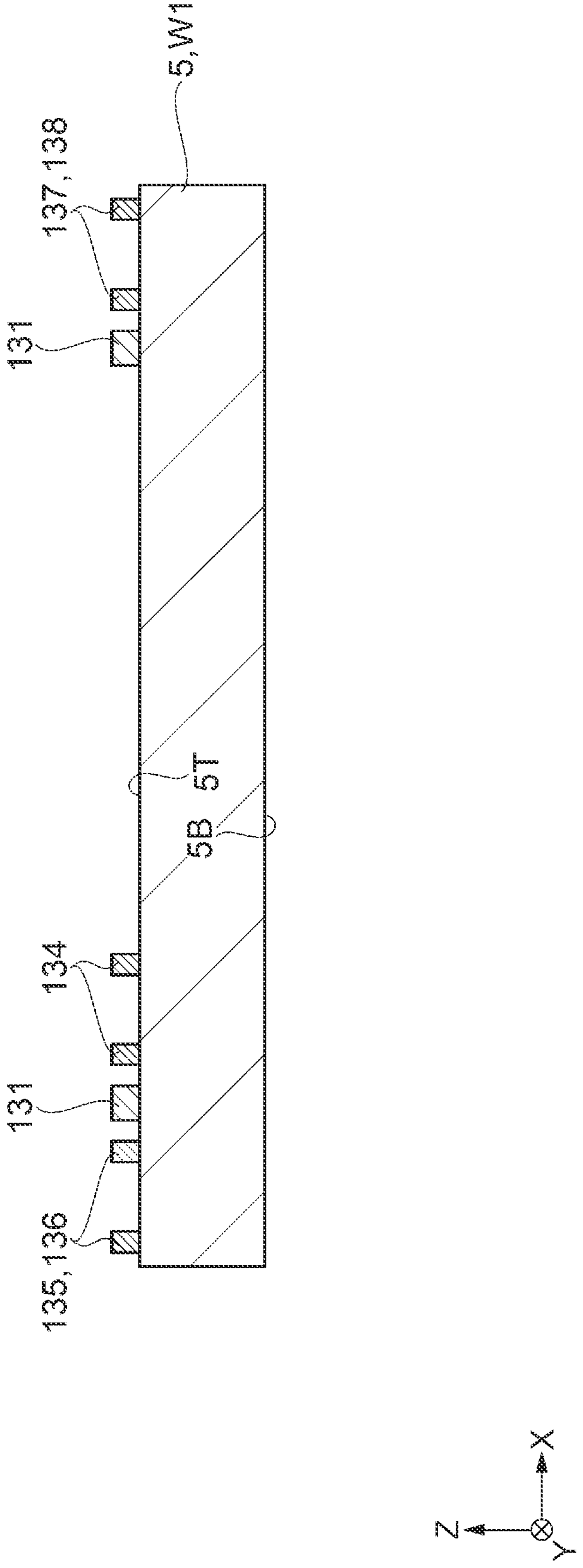
FIG. 8 is a cross-sectional view showing a method for manufacturing the vibrator device.

As shown in FIG. 8, the bonding layers 131, 134, 135, 136, 137, 138 are formed on the third surface 5T that is the upper surface of the first substrate 5.

The bonding layers 131, 134, 135, 136, 137, 138 are each formed by laminating a bonding metal layer made of gold and an adhesion improvement layer made of titanium. The adhesion improvement layer is disposed between the bonding metal layer and the third surface 5T of the first substrate 5.

The bonding layers 131, 134, 135, 136, 137, 138 are respectively bonded to bonding layers 231, 234, 235, 236, 237, 238 to be described later in the bonding step S8 to be described later. The bonding layers 131, 134, 135, 136, 137, 138 are respectively bonded to the bonding layers 231, 234, 235, 236, 237, 238, thereby forming the first sealing bonding member 31 and the first bonding members 34, 35, 36, 37, 38.

In the first substrate bonding layer formation step S2, the wiring 85 (not shown) is formed on the third surface 5T of the first substrate 5. The wiring 85 is disposed inside the annular bonding layer 134 and is electrically coupled to the bonding layer 134. In the embodiment, the wiring 85 and the bonding layers 131, 134, 135, 136, 137, 138 are formed simultaneously. "Formed simultaneously" means being collectively formed in the same step. The wiring 85 is formed by laminating a bonding metal layer made of gold and an adhesion improvement layer made of titanium.

The wiring 85 may not be formed simultaneously with the bonding layers 131, 134, 135, 136, 137, 138. The wiring 85 may be made of metal different from that of the bonding layers 131, 134, 135, 136, 137, 138. For example, the wiring 85 may be made of aluminum or copper.

In the element substrate preparation step S3, a quartz crystal substrate W2 serving as a base material of the element substrate 3 is prepared. The quartz crystal substrate W2 is an AT cut quartz crystal substrate. A plurality of element substrates 3 are formed from the quartz crystal substrate W2. In the following, description and illustration will be made focusing on one element substrate 3 for convenience of description.

Figure 9:
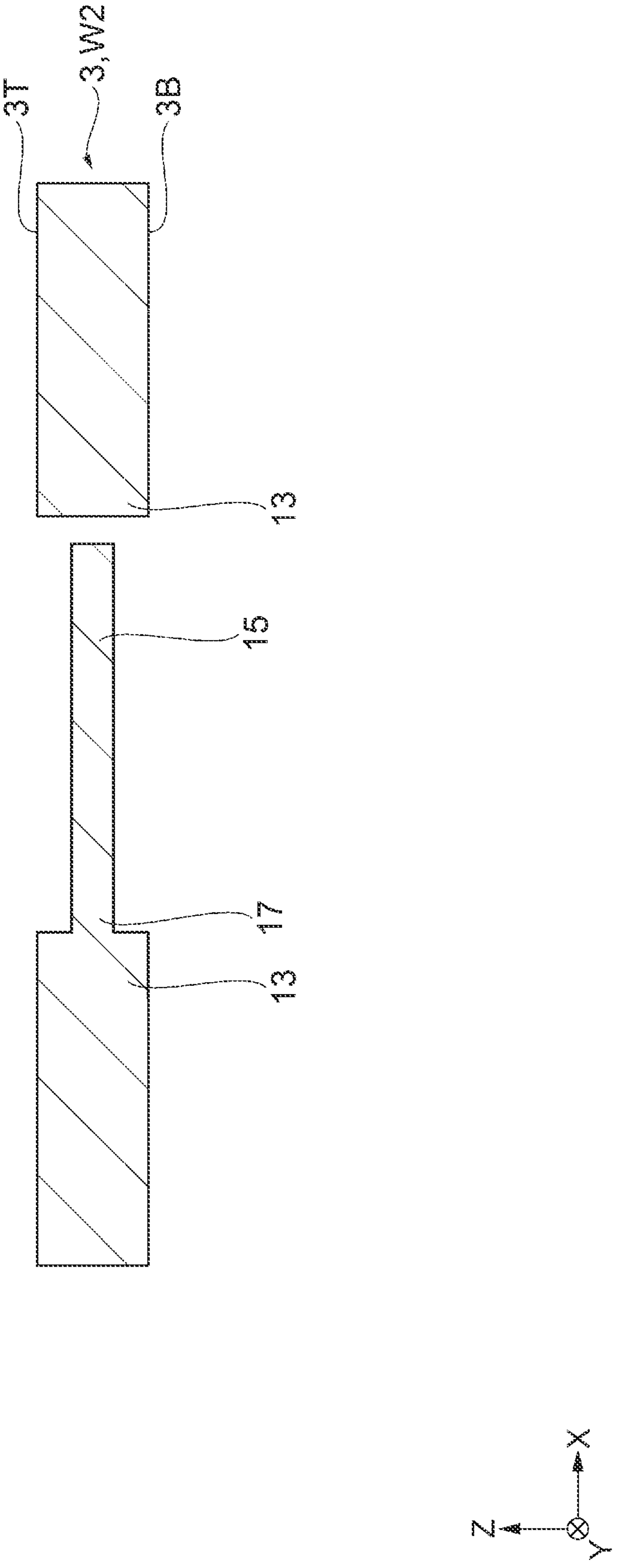
FIG. 9 is a cross-sectional view showing the method for manufacturing the vibrator device.

In the vibrator formation step S4, as shown in FIG. 9, the frame portion 13, the vibrator 15, and the coupling portions 17 are formed by etching the quartz crystal substrate W2.

Figure 10:
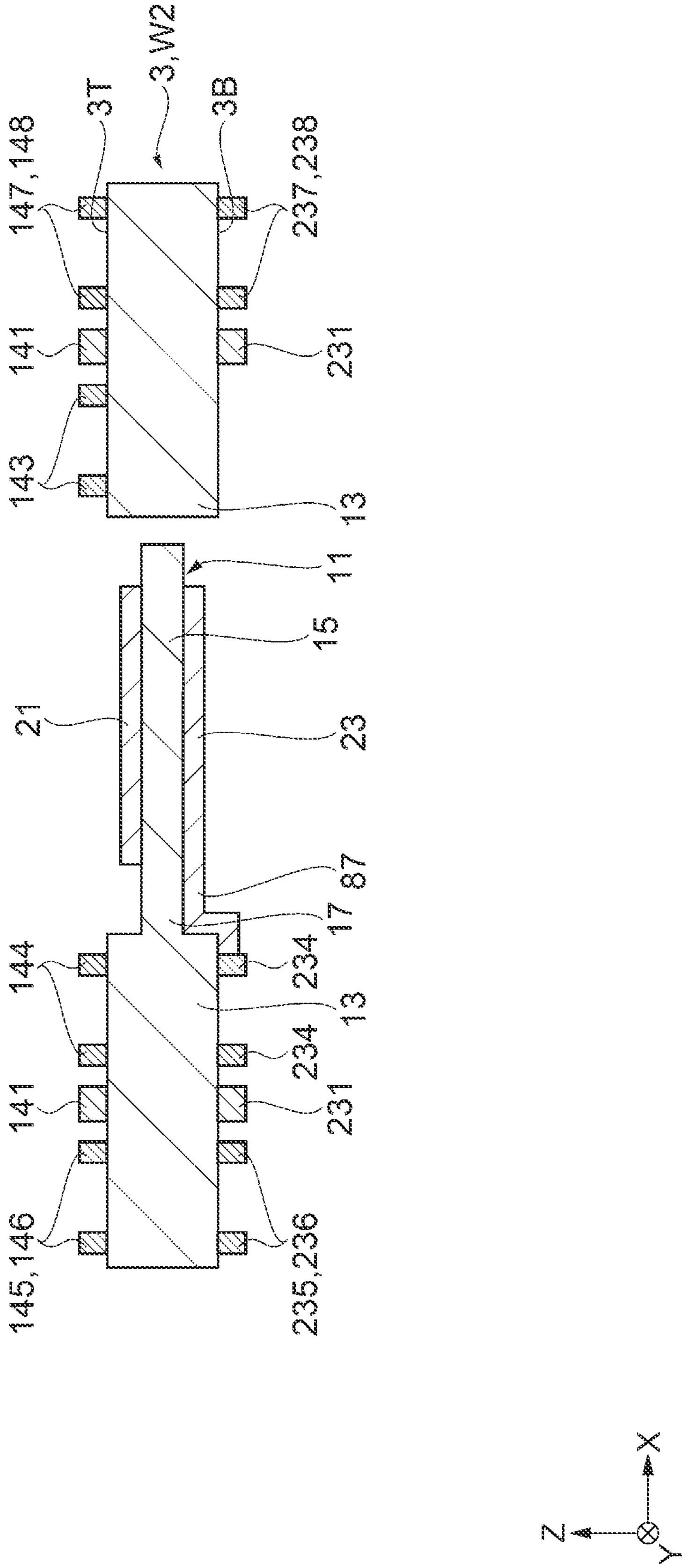
FIG. 10 is a cross-sectional view showing the method for manufacturing the vibrator device.

In the element substrate bonding layer formation step S5, as shown in FIG. 10, the bonding layers 231, 234, 235, 236, 237, 238 and bonding layers 141, 143, 144, 145, 146, 147, 148 are formed on the first substrate 5.

The bonding layers 231, 234, 235, 236, 237, 238 are formed on the first surface 3B that is the lower surface of the element substrate 3.

The bonding layers 231, 234, 235, 236, 237, 238 are each formed by laminating a bonding metal layer made of gold and an adhesion improvement layer made of titanium. The adhesion improvement layer is disposed between the bonding metal layer and the first surface 3B of the element substrate 3.

The bonding layers 141, 143, 144, 145, 146, 147, 148 are formed on the second surface 3T that is an upper surface of the element substrate 3.

The bonding layers 141, 143, 144, 145, 146, 147, 148 are each formed by laminating a bonding metal layer made of gold and an adhesion improvement layer made of titanium. The adhesion improvement layer is disposed between the bonding metal layer and the second surface 3T of the element substrate 3.

The bonding layers 141, 143, 144, 145, 146, 147, 148 are respectively bonded to bonding layers 241, 243, 244, 245, 246, 247, 248 to be described later in the bonding step S8 to be described later. The bonding layers 141, 143, 144, 145, 146, 147, 148 are respectively bonded to the bonding layers 241, 243, 244, 245, 246, 247, 248, thereby forming the second sealing bonding member 41 and the second bonding members 44, 45, 46, 47, 48.

In the element substrate bonding layer formation step S5, the first excitation electrode 21, the second excitation electrode 23, the leading-out wiring 87, the leading-out wiring 83 (not shown), and the wiring 81 (not shown) are formed.

The first excitation electrode 21, the leading-out wiring 83, and the wiring 81 are formed on the second surface 3T of the element substrate 3. The wiring 81 is disposed inside the annular bonding layer 143 in the plan view, and is electrically coupled to the bonding layer 143.

The second excitation electrode 23 and the leading-out wiring 87 are formed on the first surface 3B of the element substrate 3.

In the embodiment, the first excitation electrode 21, the leading-out wiring 83, and the wiring 81 are formed simultaneously with the bonding layers 141, 143, 144, 145, 146, 147, 148.

The first excitation electrode 21, the leading-out wiring 83, and the wiring 81 may not be formed simultaneously with the bonding layers 141, 143, 144, 145, 146, 147, 148. The first excitation electrode 21, the leading-out wiring 83, and the wiring 81 may be made of metal different from that of the bonding layers 141, 143, 144, 145, 146, 147, 148. For example, the first excitation electrode 21, the leading-out wiring 83, and the wiring 81 may be made of aluminum or copper.

In the embodiment, the second excitation electrode 23 and the leading-out wiring 87 are formed simultaneously with the bonding layers 231, 234, 235, 236, 237, 238.

The second excitation electrode 23 and the leading-out wiring 87 may not be formed simultaneously with the bonding layers 231, 234, 235, 236, 237, 238. The second excitation electrode 23 and the leading-out wiring 87 may be made of metal different from that of the bonding layers 231, 234, 235, 236, 237, 238. For example, the second excitation electrode 23 and the leading-out wiring 87 may be made of aluminum or copper.

In the second substrate preparation step S6, a quartz crystal substrate W3 serving as a base material of the element substrate 3 is prepared. The quartz crystal substrate W3 is an AT cut quartz crystal substrate. A plurality of second substrates 7 are formed from the quartz crystal substrate W3. In the following, description and illustration will be made focusing on one second substrate 7 for convenience of description.

In the second substrate bonding layer formation step S7, the bonding layers 241, 243, 244, 245, 246, 247, 248 are formed on the second substrate 7.

As shown in FIG. 11, the bonding layers 241, 243, 244, 245, 246, 247, 248 are formed on the fifth surface 7B that is the lower surface of the second substrate 7.

The bonding layers 241, 243, 244, 245, 246, 247, 248 are each formed by laminating a bonding metal layer made of gold and an adhesion improvement layer made of titanium. The adhesion improvement layer is disposed between the bonding metal layer and the fifth surface 7B of the second substrate 7.

In the bonding step S8, the element substrate 3 and the first substrate 5 are bonded to each other, and the element substrate 3 and the second substrate 7 are bonded to each other. In other words, in the bonding step S8, the quartz crystal substrate W2 on which the plurality of element substrates 3 are formed and the quartz crystal substrate W1 on which the plurality of first substrates 5 are formed are bonded to each other, and the quartz crystal substrate W2 on which the plurality of element substrates 3 are formed and the quartz crystal substrate W3 on which the plurality of second substrates 7 are formed are bonded to each other, thereby forming a quartz crystal substrate in which the quartz crystal substrate W1, the quartz crystal substrate W2, and the quartz crystal substrate W3 are bonded together.

In the embodiment, first, the element substrate 3 and the first substrate 5 are bonded to each other, and then, the second substrate 7 and the element substrate 3 to which the first substrate 5 is bonded are bonded to each other. An order of bonding the element substrate 3, the first substrate 5, and the second substrate 7 is not limited thereto. For example, the first substrate 5 and the second substrate 7 may be bonded to the element substrate 3 simultaneously with the element substrate 3 interposed therebetween.

Figure 12:
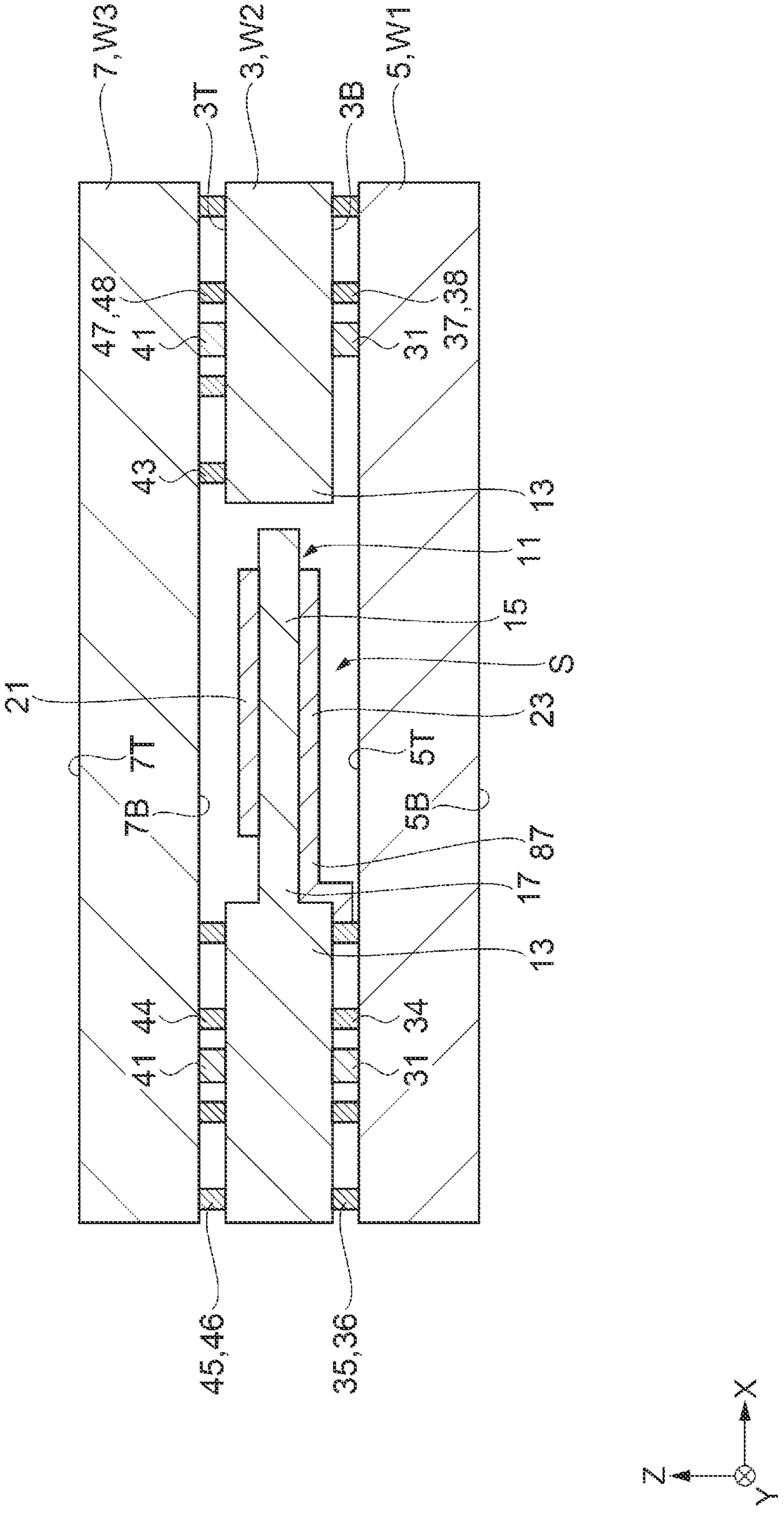
FIG. 12 is a cross-sectional view showing the method for manufacturing the vibrator device.

As shown in FIG. 12, in the bonding step S8, the bonding layers 131, 134, 135, 136, 137, 138 formed on the third surface 5T of the first substrate 5 shown in FIG. 8 and the bonding layers 231, 234, 235, 236, 237, 238 formed on the first surface 3B of the element substrate 3 shown in FIG. 10 are respectively bonded to each other, whereby the first sealing bonding member 31 and the first bonding members 34, 35, 36, 37, 38 are formed between the third surface 5T and the first surface 3B.

In the embodiment, the bonding layers 131, 134, 135, 136, 137, 138 and the bonding layers 231, 234, 235, 236, 237, 238 are bonded by activation bonding. Specifically, surfaces of the bonding layers 131, 134, 135, 136, 137, 138 and surfaces of the bonding layers 231, 234, 235, 236, 237, 238 are each activated by being irradiated with a neutral argon ion beam or the like. Thereafter, the surfaces of the bonding layers 131, 134, 135, 136, 137, 138 are brought into contact with the surfaces of the bonding layers 231, 234, 235, 236, 237, 238, respectively. Accordingly, the surfaces of the bonding layers 131, 134, 135, 136, 137, 138 are bonded to the surfaces of the bonding layers 231, 234, 235, 236, 237, 238.

The first sealing bonding member 31 is formed by activating and bonding the bonding layer 131 and the bonding layer 231. The first sealing bonding member 31 is made of metal. Specifically, the first sealing bonding member 31 includes a bonding metal layer made of gold and an adhesion improvement layer made of titanium. The adhesion improvement layer is disposed between the bonding metal layer and the first surface 3B and between the bonding metal layer and the third surface 5T.

The first bonding member 34 is formed by activating and bonding the bonding layer 134 and the bonding layer 234. Similarly, the first bonding members 35, 36, 37, 38 are formed by activating and bonding the bonding layers 135, 136, 137, 138 and the bonding layers 235, 236, 237, 238, respectively. The first bonding members 34, 35, 36, 37, 38 are made of metal. Specifically, each of the first bonding members 34, 35, 36, 37, 38 includes a bonding metal layer made of gold and an adhesion improvement layer made of titanium. The adhesion improvement layer is disposed between the bonding metal layer and the first surface 3B and between the bonding metal layer and the third surface 5T.

In the bonding step S8, the bonding layers 141, 143, 144, 145, 146, 147, 148 formed on the second surface 3T of the element substrate 3 shown in FIG. 10 and the bonding layers 241, 243, 244, 245, 246, 247, 248 formed on the fifth surface 7B of the second substrate 7 shown in FIG. 11 are respectively bonded to each other, whereby the second sealing bonding member 41 and the second bonding members 43, 44, 45, 46, 47, 48 are formed between the second surface 3T and the fifth surface 7B.

In the embodiment, the bonding layers 141, 143, 144, 145, 146, 147, 148 and the bonding layers 241, 243, 244, 245, 246, 247, 248 are bonded by activation bonding. Specifically, surfaces of the bonding layers 141, 143, 144, 145, 146, 147, 148 and surfaces of the bonding layers 241, 243, 244, 245, 246, 247, 248 are each activated by being irradiated with a neutral argon ion beam or the like. Thereafter, the surfaces of the bonding layers 141, 143, 144, 145, 146, 147, 148 and the surfaces of the bonding layers 231, 234, 235, 236, 237, 238 are brought into contact with each other to be bonded to each other, respectively.

The second sealing bonding member 41 is formed by activating and bonding the bonding layer 141 and the bonding layer 241. The second sealing bonding member 41 is made of metal. Specifically, the second sealing bonding member 41 includes a bonding metal layer made of gold and an adhesion improvement layer made of titanium. The adhesion improvement layer is disposed between the bonding metal layer and the second surface 3T and between the bonding metal layer and the fifth surface 7B.

The second bonding member 43 is formed by activating and bonding the bonding layer 143 and the bonding layer 243. Similarly, the second bonding members 44, 45, 46, 47, 48 are formed by activating and bonding the bonding layers 144, 145, 146, 147, 148 and the bonding layers 244, 245, 246, 247, 248, respectively. The second bonding members 43, 44, 45, 46, 47, 48 are made of metal. Specifically, each of the second bonding members 43, 44, 45, 46, 47, 48 includes a bonding metal layer made of gold and an adhesion improvement layer made of titanium. The adhesion improvement layer is disposed between the bonding metal layer and the second surface 3T and between the bonding metal layer and the fifth surface 7B.

In this manner, a package in which the first substrate 5, the element substrate 3, and the second substrate 7 are laminated in this order is formed.

The bonding step S8 is performed in a depressurized state. Therefore, the cavity S formed by bonding the element substrate 3 and the first substrate 5 to each other and bonding the element substrate 3 and the second substrate 7 to each other is brought into the depressurized state.

Figure 13:
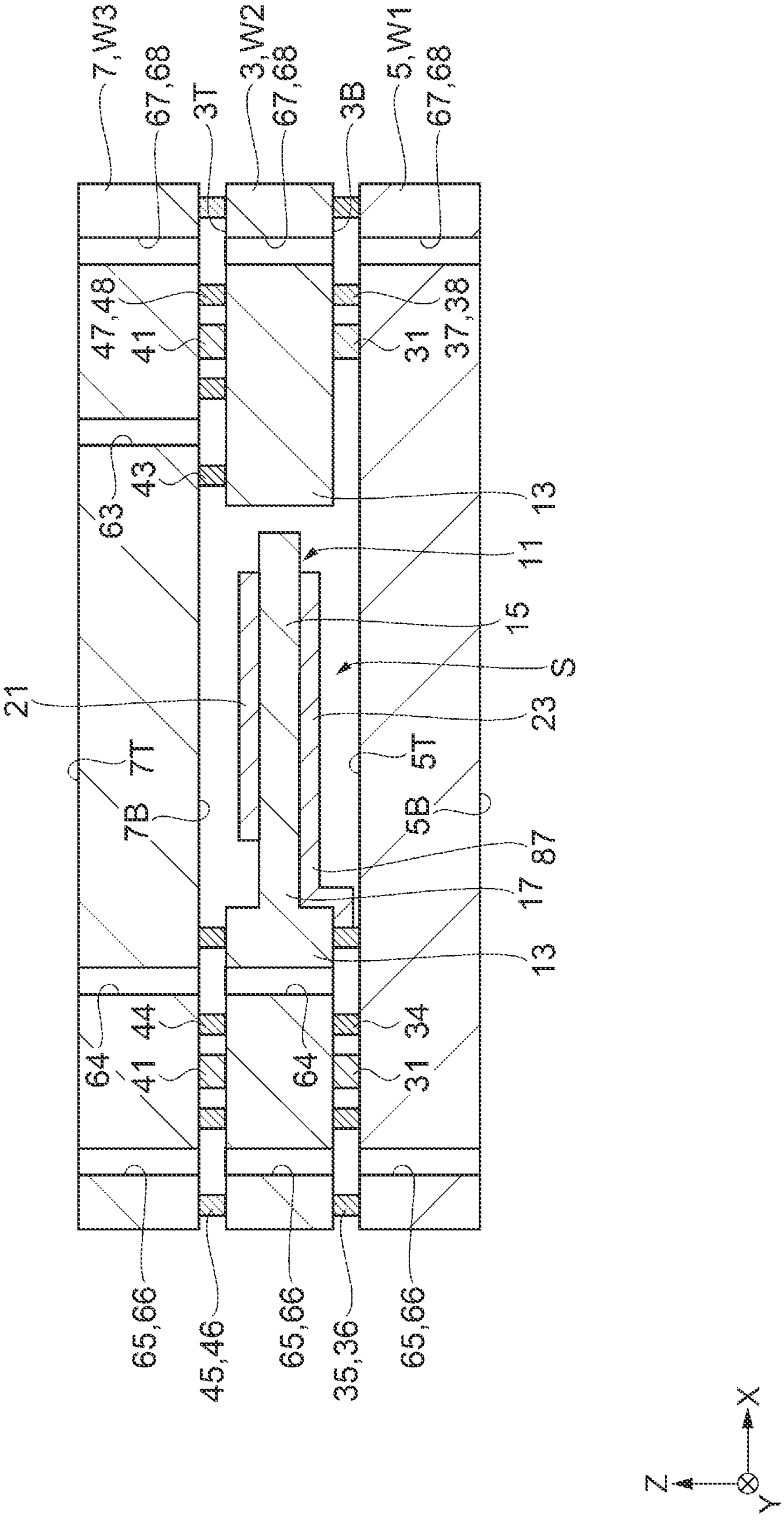
FIG. 13 is a cross-sectional view showing the method for manufacturing the vibrator device.

In the through hole formation step S9, as shown in FIG. 13, the package in which the first substrate 5, the element substrate 3, and the second substrate 7 are laminated in this order is dry-etched from a sixth surface 7T side of the second substrate 7 to form the through holes 63, 64, 65, 66, 67, 68. The through holes 63, 64, 65, 66, 67, 68 are formed at positions overlapping the frame portion 13 in the plan view.

In the embodiment, dry etching is reactive ion etching and is performed using a reactive ion etching device (RIE device). A reaction gas introduced into the RIE device is not particularly limited, and for example, $SF_6$, $CF_4$, $C_2F_4$, $C_2F_6$, $C_3F_6$, or $C_4F_8$ can be used.

In the dry etching, crystal anisotropy is less likely to occur during etching than in wet etching. Therefore, by the dry etching, the inner wall surfaces of the through holes 63, 64, 65, 66, 67, 68 are not likely to have protrusions due to crystal anisotropy, and become smooth surfaces.

The through hole 63 penetrates between the sixth surface 7T and the fifth surface 7B of the second substrate 7.

The through hole 63 is formed in a region of the fifth surface 7B surrounded by the annular second bonding member 43 with a gap between the through hole 63 and the second bonding member 43.

Accordingly, when the through hole 63 is formed, plasma generated by the reaction gas is less likely to come into contact with the second bonding member 43. Therefore, the plasma generated by the reaction gas is stabilized, and the dry etching can be stably performed.

The through hole 64 penetrates between the sixth surface 7T and the fifth surface 7B of the second substrate 7 and between the second surface 3T and the first surface 3B of the element substrate 3.

The through hole 64 is formed in regions of the fifth surface 7B and the second surface 3T surrounded by the annular second bonding member 44 with a gap between the through hole 64 and the second bonding member 44. The through hole 64 is formed in a region of the first surface 3B surrounded by the annular first bonding member 34 with a gap between the through hole 64 and the first bonding member 34.

Accordingly, when the through hole 64 is formed, plasma generated by the reaction gas is less likely to come into contact with the second bonding member 44 and the first bonding member 34. Therefore, the plasma generated by the reaction gas is stabilized, and the dry etching can be stably performed.

The through holes 65, 66, 67, 68 penetrate between the sixth surface 7T and the fifth surface 7B of the second substrate 7, between the second surface 3T and the first surface 3B of the element substrate 3, and between the third surface 5T and the fourth surface 5B of the first substrate 5.

The through holes 65, 66, 67, 68 are formed in regions of the fifth surface 7B and the second surface 3T surrounded by the annular second bonding members 45, 46, 47, 48 with gaps between the through holes 65, 66, 67, 68 and the second bonding members 45, 46, 47, 48, respectively. The through holes 65, 66, 67, 68 are formed in regions of the first surface 3B and the third surface 5T surrounded by the annular first bonding members 35, 36, 37, 38 with gaps between the through holes 65, 66, 67, 68 and the first bonding members 35, 36, 37, 38, respectively.

Accordingly, when the through holes 65, 66, 67, 68 are formed, plasma generated by the reaction gas is less likely to come into contact with the second bonding members 45, 46, 47, 48 and the first bonding members 35, 36, 37, 38. Therefore, the plasma generated by the reaction gas is stabilized, and the dry etching can be stably performed.

In the embodiment, for example, the first bonding member 34 and the second bonding member 44 surround the through hole 64 with the gap between the first bonding member 34 or the second bonding member 44 and the through hole 64, and such an arrangement is applied to all the first bonding members and all the second bonding members. Such an arrangement is preferably applied to all the first bonding members and all the second bonding members, but is not limited to being applied to all the first bonding members and all the second bonding members. For example, the second bonding member 44 may surround the through hole 64 with a gap between the second bonding member 44 and the through hole 64, and the first bonding member 34 may be disposed without a gap between the first bonding member 34 and the through hole 64. In other words, at least one of the first bonding members 34, 35, 36, 37, 38 and the second bonding members 43, 44, 45, 46, 47, 48 may surround the through holes 63, 64, 65, 66, 67, 68 with gaps between the one and the through holes 63, 64, 65, 66, 67, 68, respectively.

In the embodiment, as described above and as shown in FIGS. 5 and 6, each of the outer shapes of the through holes 63, 64, 65, 66, 67, 68 in the sixth surface 7T in the plan view is a track shape.

Each of the outer shapes of the through holes 63, 64, 65, 66, 67, 68 in the plan view includes the first portion 101, the second portion 102, the third portion 103, and the fourth portion 104.

The first portion 101 is one of two linear portions constituting the track shape.

The first portion 101 faces the center P1 of the cavity S in the plan view. Specifically, the first portion 101 is disposed such that a direction along a normal line of the linear portion, which is the first portion 101, faces a center P1 side of the cavity S.

The second portion 102 is one of two curved portions constituting the track shape. The second portion 102 has a semicircular shape.

The third portion 103 is the other linear portion of the two linear portions constituting the track shape. The third portion 103 is disposed opposite from the center P1 of the cavity S with the first portion 101 interposed therebetween.

The fourth portion 104 is the other curved portion of the two curved portions constituting the track shape. The fourth portion 104 has a semicircular shape.

Figure 14:
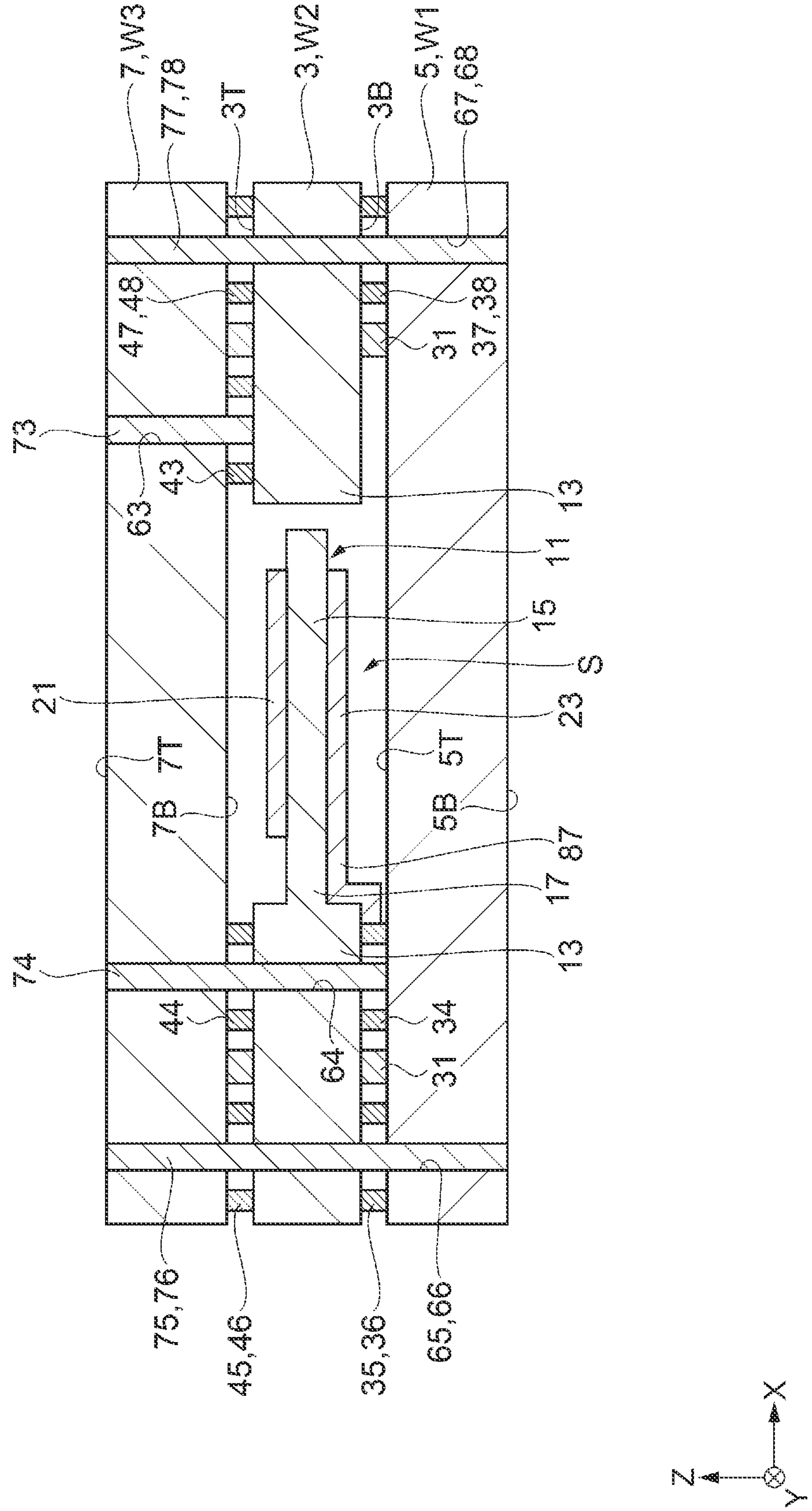
FIG. 14 is a cross-sectional view showing the method for manufacturing the vibrator device.

In the through electrode formation step S10, as shown in FIG. 14, the through electrodes 73, 74, 75, 76, 77, 78 are respectively formed in the through holes 63, 64, 65, 66, 67, 68.

In the embodiment, metal such as copper is formed in the through holes 63, 64, 65, 66, 67, 68 by plating. Accordingly, the through holes 63, 64, 65, 66, 67, 68 are filled with the metal to form the through electrodes 73, 74, 75, 76, 77, 78. At this time, a plating solution enters between the fifth surface 7B of the second substrate 7 and the second surface 3T of the element substrate 3 and between the first surface 3B of the element substrate 3 and the third surface 5T of the first substrate 5 via the through holes 63, 64, 65, 66, 67, 68, whereby the metal in the plating solution is deposited between the fifth surface 7B of the second substrate 7 and the second surface 3T of the element substrate 3 and between the first surface 3B of the element substrate 3 and the third surface 5T of the first substrate 5. The metal deposited between the fifth surface 7B of the second substrate 7 and the second surface 3T of the element substrate 3 and between the first surface 3B of the element substrate 3 and the third surface 5T of the first substrate 5 constitutes a part of the through electrodes 73, 74, 75, 76, 77, 78.

In the embodiment, the through electrodes 73, 74, 75, 76, 77, 78 are formed by forming the metal in the through holes

63, 64, 65, 66, 67, 68, but the through electrodes 73, 74, 75, 76, 77, 78 may be formed by forming a metal film on the side surfaces, that is, the inner wall surfaces of the through holes 63, 64, 65, 66, 67, 68.

As described above, by filling the through holes 63, 64, 65, 66, 67, 68 with the metal or by forming the metal film on the side surfaces of the through holes 63, 64, 65, 66, 67, 68, the outer shapes of the through electrodes 73, 74, 75, 76, 77, 78 in the plan view are the same as the outer shapes of the through holes 63, 64, 65, 66, 67, 68 in the plan view, respectively.

Figure 15:
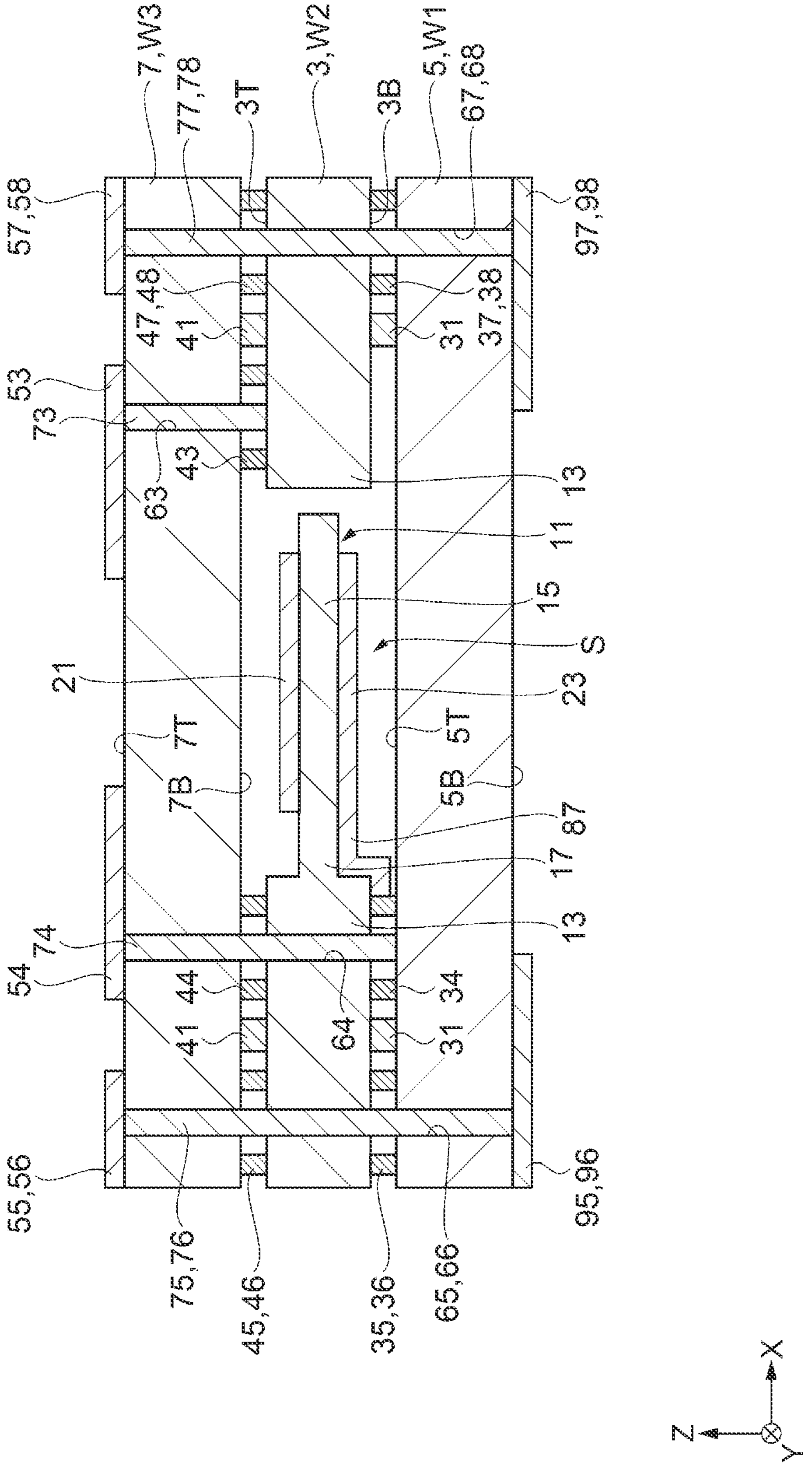
FIG. 15 is a cross-sectional view showing the method for manufacturing the vibrator device.

In the electrode pattern formation step S11, as shown in FIG. 15, the electrode patterns 53, 54, 55, 56, 57, 58 are formed on the sixth surface 7T of the second substrate 7, and the external terminals 95, 96, 97, 98 are formed on the fourth surface 5B of the first substrate 5.

In the dicing step S12, by cutting the quartz crystal substrate formed by bonding together the quartz crystal substrate W1 on which the plurality of first substrates 5 are formed, the quartz crystal substrate W2 on which the plurality of element substrates 3 are formed, and the quartz crystal substrate W3 on which the plurality of second substrates 7 are formed, a plurality of packages formed in the quartz crystal substrate are diced into individual pieces.

After the dicing step S12, a frequency of the vibrator element 11 accommodated in the cavity S of the diced package may be adjusted. The frequency of the vibrator element 11 can be adjusted by a known method. For example, when the first excitation electrode 21 or the second excitation electrode 23 is formed, a metal film serving as a weight for frequency adjustment is formed on the upper surface or the lower surface of the vibrator 15, and the metal film is removed by a laser or the like, whereby the frequency of the vibrator element 11 can be adjusted.

In the circuit element mounting step S13, the circuit element 9 is mounted on the sixth surface 7T of the second substrate 7.

The circuit element 9 is electrically coupled to the electrode patterns 53, 54, 55, 56, 57, 58 formed on the sixth surface 7T of the second substrate 7 via the bonding members 59. In this manner, the vibrator device 1 shown in FIG. 1 is obtained.

The vibrator device 1 and the method for manufacturing the vibrator device 1 according to the first embodiment have been described above.

As described above, according to the embodiment, the following effects can be attained.

The vibrator device 1 includes: the element substrate 3 including the frame portion 13 having the first surface 3B and the second surface 3T at an opposite side from the first surface 3B, and the vibrator element 11 disposed inside the frame portion 13; the first substrate 5 having the third surface 5T on a first surface 3B side and the fourth surface 5B at an opposite side from the third surface 5T, the first substrate 5 being bonded to the first surface 3B of the frame portion 13 at the third surface 5T; the second substrate 7 having the fifth surface 7B on a second surface 3T side and the sixth surface 7T at an opposite side from the fifth surface 7B, the second substrate 7 being bonded to the second surface 3T of the frame portion 13 at the fifth surface 7B; and the cavity S surrounded by the frame portion 13, the first substrate 5, and the second substrate 7. The second substrate 7 includes through electrodes 73, 74, 75, 76, 77, 78 at positions overlapping the frame portion 13 in a plan view. An outer shape of each of the through electrodes 73, 74, 75, 76, 77, 78 in the sixth surface 7T in the plan view includes the first portion 101 and the second portion 102, and the first portion 101 is located at a position closer to the cavity S than is the second portion 102. The curvature C1 of the first portion 101 is smaller than the curvature C2 of the second portion 102.

Accordingly, concentration of a stress in the first portion 101, which is a portion close to the cavity S, of the outer shape of each of the through electrodes 73, 74, 75, 76, 77, 78 in the plan view is reduced, and breakage of the through holes 63, 64, 65, 66, 67, 68 and the second substrate 7 and airtightness failure of the cavity S can be prevented.

A method for manufacturing the vibrator device 1 includes: the bonding step S8 of bonding the element substrate 3 and the first substrate 5 to each other and bonding the element substrate 3 and the second substrate 7 to each other; the through hole formation step S9 of subsequently forming the through holes 63, 64, 65, 66, 67, 68 penetrating the second substrate 7 at positions of the second substrate 7 overlapping the frame portion 13 in a plan view; the through electrode formation step S10 of forming the through electrodes 73, 74, 75, 76, 77, 78 by forming a metal film on a side surface of each of the through holes 63, 64, 65, 66, 67, 68 or metal in each of the through holes 63, 64, 65, 66, 67, 68; and the circuit element mounting step S13 of mounting the circuit element 9 on the sixth surface 7T of the second substrate 7. An outer shape of each of the through electrodes 73, 74, 75, 76, 77, 78 formed in the through electrode formation step S10 in the sixth surface 7T in the plan view includes the first portion 101 and the second portion 102, and the first portion 101 is located at a position closer to the cavity S than is the second portion 102. The curvature C1 of the first portion 101 is smaller than the curvature C2 of the second portion 102.

Accordingly, concentration of a stress in the first portion 101, which is a portion close to the cavity S, of the outer shape of each of the through electrodes 73, 74, 75, 76, 77, 78 in the plan view is reduced, and breakage of the through holes 63, 64, 65, 66, 67, 68 and the second substrate 7 and airtightness failure of the cavity S can be prevented.

A method for manufacturing the vibrator device 1 includes: the bonding step S8 of bonding the element substrate 3 and the first substrate 5 to each other via the first bonding members 34, 35, 36, 37, 38 made of metal, and bonding the element substrate 3 and the second substrate 7 to each other via the second bonding members 43, 44, 45, 46, 47, 48 made of metal; the through hole formation step S9 of subsequently forming, by dry etching, the through holes 63, 64, 65, 66, 67, 68 penetrating the second substrate 7 at positions of the second substrate 7 overlapping the frame portion 13 in a plan view; the through electrode formation step S10 of forming through electrodes 73, 74, 75, 76, 77, 78 electrically coupling the second substrate 7 and the element substrate 3 or the second substrate 7 and the first substrate 5 by forming a metal film on a side surface of each of the through holes 63, 64, 65, 66, 67, 68 or metal in the through holes 63, 64, 65, 66, 67, 68; and the circuit element mounting step S13 of mounting the circuit element 9 on the sixth surface 7T of the second substrate 7. In the bonding step S8, at least one of the first bonding members 34, 35, 36, 37, 38 and the second bonding members 43, 44, 45, 46, 47, 48 surround the through holes 63, 64, 65, 66, 67, 68 with gaps between the one and the through holes 63, 64, 65, 66, 67, 68, respectively.

Accordingly, when the through holes 63, 64, 65, 66, 67, 68 are formed, plasma generated by a reaction gas is less likely to come into contact with the second bonding members 43, 44, 45, 46, 47, 48 and the first bonding members 34, 35, 36, 37, 38. Therefore, the plasma generated by the reaction gas is stabilized, and the through holes 63, 64, 65, 66, 67, 68 can be stably formed by the dry etching.

2. Second Embodiment

Next, the vibrator device 1 according to a second embodiment will be described with reference to FIG. 16.

The vibrator device 1 according to the second embodiment is the same as that of the first embodiment except that outer shapes of the through electrodes 73, 74, 75, 76, 77, 78 in the sixth surface 7T in the plan view are different from those according to the first embodiment.

The same components as those of the first embodiment described above are denoted by the same reference numerals, and description thereof will be omitted.

In the embodiment, similarly to the first embodiment, among the through electrodes 73, 74, 75, 76, 77, 78 respectively formed in the through holes 63, 64, 65, 66, 67, 68, the through electrode 73 formed in the through hole 63 will be described as a representative example.

As shown in FIG. 16, the outer shape of the through electrode 73 in the sixth surface 7T in the plan view is a partially circular shape. The partially circular shape is a shape in which a part of a circle is cut out by a straight line. That is, the partially circular shape is a shape having a linear portion and a curved portion that is a circular arc.

The outer shape of the through electrode 73 in the plan view includes the first portion 101, the second portion 102, the third portion 103, and the fourth portion 104.

The first portion 101 is a linear portion constituting the partially circular shape.

The first portion 101 faces the center P1 of the cavity S in the plan view. Specifically, the first portion 101 is disposed such that a direction along a normal line of the linear portion, which is the first portion 101, faces a center P1 side of the cavity S.

The third portion 103 is a curved portion constituting the partially circular shape. The third portion 103 is disposed opposite from the center P1 of the cavity S with the first portion 101 interposed therebetween.

The second portion 102 and the fourth portion 104 are disposed between the first portion 101 that is the linear portion and the third portion 103 that is the curved portion.

The second portion 102 is coupled to an end portion of the first portion 101 on the plus side in the Y direction and an end portion of the third portion 103 on the plus side in the Y direction. The fourth portion 104 is coupled to an end portion of the first portion 101 on the minus side in the Y direction and an end portion of the third portion 103 on the minus side in the Y direction.

The second portion 102 and the fourth portion 104 are curved portions. The first portion 101, the second portion 102, the third portion 103, and the fourth portion 104 are continuously coupled so as not to form corner portions in the partially circular shape.

By disposing the first portion 101, the second portion 102, and the fourth portion 104 in this manner, the first portion 101 is disposed at a position closer to the cavity S than are the second portion 102 and the fourth portion 104 when viewed from the center P1 side of the cavity S. In other words, in the outer shape of the through electrode 73 in the sixth surface 7T in the plan view, a portion closest to the cavity S when viewed from the center P1 side of the cavity S is the first portion 101.

The first portion 101 is the linear portion, and the curvature C1 of the first portion 101 is 0.

The second portion 102 and the fourth portion 104 are the curved portions, and each of the curvatures C2, C4 of the second portion 102 and the fourth portion 104 is larger than 0. In other words, the curvature C1 of the first portion 101 is smaller than each of the curvatures C2, C4 of the second portion 102 and the fourth portion 104.

In this manner, the outer shape of the through electrode 73 in the sixth surface 7T in the plan view includes the first portion 101 and the second portion 102, the first portion 101 is located at the position closer to the cavity S than is the second portion 102 when viewed from the center P1 side of the cavity S, and the curvature C1 of the first portion 101 is smaller than the curvature C2 of the second portion 102.

Accordingly, concentration of the stress in the first portion 101, which is the portion close to the cavity S, of the outer shape of the through electrode 73 in the plan view is reduced, and breakage of the through hole 63 and the second substrate 7 and airtightness failure of the cavity S can be prevented.

The third portion 103 is disposed at a position farther from the cavity S than are the second portion 102 and the fourth portion 104 when viewed from the center P1 side of the cavity S. In other words, in the outer shape of the through electrode 73 in the sixth surface 7T in the plan view, a portion farthest from the cavity S when viewed from the center P1 side of the cavity S is the third portion 103.

In the embodiment, the curvature C3 of the third portion 103 is smaller than each of the curvatures C2, C4 of the second portion 102 and the fourth portion 104.

Accordingly, concentration of the stress in the third portion 103, which is the portion far from the cavity S, of the outer shape of the through electrode 73 in the plan view is reduced, and breakage of the through hole 63 and the second substrate 7 and airtightness failure of the cavity S can be further prevented.

Among the through electrodes 73, 74, 75, 76, 77, 78 respectively formed in the through holes 63, 64, 65, 66, 67, 68, the through electrode 73 formed in the through hole 63 has been described as the representative example.

For the through electrodes 74, 75, 76, 77, 78 respectively formed in the through holes 64, 65, 66, 67, 68, the same effect as that of the through electrode 73 can also be attained by the outer shape of each of the through electrodes 74, 75, 76, 77, 78 in the sixth surface 7T in the plan view being the same as the outer shape of the through electrode 73 in the plan view.

The vibrator device 1 according to the second embodiment has been described above.

According to the embodiment, the same effects as those according to the first embodiment can be attained.

3. Third Embodiment

Next, the vibrator device 1 according to a third embodiment will be described with reference to FIG. 17.

The vibrator device 1 according to the third embodiment is the same as that of the first embodiment except that the outer shapes of the through electrodes 73, 74, 75, 76, 77, 78 in the sixth surface 7T in the plan view are different from those according to the first embodiment.

The same components as those of the first embodiment described above are denoted by the same reference numerals, and description thereof will be omitted.

In the embodiment, similarly to the first embodiment, among the through electrodes 73, 74, 75, 76, 77, 78 respectively formed in the through holes 63, 64, 65, 66, 67, 68, the through electrode 73 formed in the through hole 63 will be described as a representative example.

As shown in FIG. 17, the outer shape of the through electrode 73 in the sixth surface 7T in the plan view is an elliptical shape. A direction along a normal line of a major axis of the elliptical shape faces a center P1 side of the cavity S. In other words, a direction along a minor axis of the elliptical shape faces the center P1 side of the cavity S.

The outer shape of the through electrode 73 in the plan view includes the first portion 101, the second portion 102, the third portion 103, and the fourth portion 104.

Among a pair of elliptical arc portions intersecting the minor axis of the elliptical shape, the first portion 101 is the elliptical arc portion facing the center P1 of the cavity S in the plan view.

Among the pair of elliptical arc portions intersecting the minor axis of the elliptical shape, the third portion 103 is the elliptical arc portion opposite from the center P1 of the cavity S with the first portion 101 interposed therebetween.

The second portion 102 and the fourth portion 104 are a pair of elliptical arc portions intersecting the major axis of the elliptical shape. The second portion 102 is coupled to an end portion of the first portion 101 on the plus side in the Y direction and an end portion of the third portion 103 on the plus side in the Y direction. The fourth portion 104 is coupled to an end portion of the first portion 101 on the minus side in the Y direction and an end portion of the third portion 103 on the minus side in the Y direction.

By disposing the first portion 101, the second portion 102, and the fourth portion 104 in this manner, the first portion 101 is disposed at a position closer to the cavity S than are the second portion 102 and the fourth portion 104 when viewed from the center P1 side of the cavity S. In other words, in the outer shape of the through electrode 73 in the sixth surface 7T in the plan view, the elliptical arc portion closest to the cavity S when viewed from the center P1 side of the cavity S is the first portion 101.

The curvature C1 of the first portion 101 is smaller than each of the curvatures C2, C4 of the second portion 102 and the fourth portion 104.

In this manner, the outer shape of the through electrode 73 in the sixth surface 7T in the plan view includes the first portion 101 and the second portion 102, the first portion 101 is located at the position closer to the cavity S than is the second portion 102 when viewed from the center P1 side of the cavity S, and the curvature C1 of the first portion 101 is smaller than the curvature C2 of the second portion 102.

Accordingly, concentration of the stress in the first portion 101, which is the portion close to the cavity S, of the outer shape of the through electrode 73 in the plan view is reduced, and breakage of the through hole 63 and the second substrate 7 and airtightness failure of the cavity S can be prevented.

The third portion 103 is disposed at a position farther from the cavity S than are the second portion 102 and the fourth portion 104 when viewed from the center P1 side of the cavity S. In other words, in the outer shape of the through electrode 73 in the sixth surface 7T in the plan view, the elliptical arc portion farthest from the cavity S when viewed from the center P1 side of the cavity S is the third portion 103.

The curvature C3 of the third portion 103 is smaller than each of the curvatures C2, C4 of the second portion 102 and the fourth portion 104.

Accordingly, concentration of the stress in the third portion 103, which is the portion far from the cavity S, of the outer shape of the through electrode 73 in the plan view is reduced, and breakage of the through hole 63 and the second substrate 7 and airtightness failure of the cavity S can be further prevented.

Among the through electrodes 73, 74, 75, 76, 77, 78 respectively formed in the through holes 63, 64, 65, 66, 67, 68, the through electrode 73 formed in the through hole 63 has been described as the representative example.

For the through electrodes 74, 75, 76, 77, 78 respectively formed in the through holes 64, 65, 66, 67, 68, the same effect as that of the through electrode 73 can also be attained by the outer shape of each of the through electrodes 74, 75, 76, 77, 78 in the sixth surface 7T in the plan view being the same as the outer shape of the through electrode 73 in the plan view.

The vibrator device 1 according to the third embodiment has been described above.

According to the embodiment, the same effects as those according to the first embodiment can be attained.

The vibrator device 1 has been described above. The present disclosure is not limited thereto, and a configuration of each unit can be replaced with any configuration having the same function. In addition, any other components may be added to the present disclosure. Further, the embodiments may be appropriately combined.

In the embodiment, the point of effort that causes the stress in the through hole is described as the region of the second substrate 7 where the circuit element 9 is bonded, and in detail, the point of effort is described as being regarded as a concentrated load applied to the center P1 of the cavity S in the plan view. In other words, a position close to the cavity S or a position far from the cavity S is determined by viewing from the center P1 of the cavity S in the plan view.

A load distribution in the region of the second substrate 7 where the circuit element 9 is bonded may vary depending on a design specification of the package of the vibrator device 1 or the like. Specifically, for example, it may be appropriate to regard the point of effort that causes the stress in the through hole as a uniformly distributed load applied to the entire cavity S in the plan view. Therefore, for example, according to the design specification of the package of the vibrator device 1 or the like, a position close to the cavity S or a position far from the cavity S may be determined by viewing from a peripheral edge portion of the cavity S in the plan view.

Even in a vibrator device on which the circuit element 9 is not mounted, a stress may be locally concentrated in a portion close to the cavity S in an outer shape of a through electrode in a plan view, and the through hole may be easily broken. For example, an electrode for coupling the vibrator device and the outside may be formed on the sixth surface 7T of the second substrate 7, and a through electrode electrically coupled to the electrode may be provided on the second substrate 7. For example, when a vibrator device is mounted on a customer substrate, an external force may be applied to the sixth surface 7T of the second substrate 7. Therefore, a vibrator device to which the present disclosure is applied is not limited to the first to third embodiments described above, and the present disclosure may be applied to a vibrator device on which the circuit element 9 is not mounted.

What is claimed is:

1. A vibrator device comprising:

an element substrate including a frame portion having a first surface and a second surface at an opposite side from the first surface, and a vibrator element disposed inside the frame portion;

a first substrate having a third surface on a first surface side and a fourth surface at an opposite side from the third surface, the first substrate being bonded to the first surface of the frame portion at the third surface;

a second substrate having a fifth surface on a second surface side and a sixth surface at an opposite side from the fifth surface, the second substrate being bonded to the second surface of the frame portion at the fifth surface; and a cavity surrounded by the frame portion, the first substrate, and the second substrate, wherein the second substrate includes a through electrode at a position overlapping the frame portion in a plan view, an outer shape of the through electrode in the sixth surface in the plan view includes a first portion and a second portion, the first portion is located at a position closer to the cavity than is the second portion, and a curvature of the first portion is smaller than a curvature of the second portion.

2. The vibrator device according to claim 1, wherein the outer shape of the through electrode in the sixth surface in the plan view includes a third portion, the third portion is located farther from the cavity than is the second portion, and a curvature of the third portion is smaller than the curvature of the second portion.

3. The vibrator device according to claim 2, wherein the outer shape of the through electrode in the sixth surface in the plan view includes a fourth portion, the first portion and the third portion are linear portions, the second portion and the fourth portion are curved portions, the second portion couples one end of the first portion and one end of the third portion, and the fourth portion couples the other end of the first portion and the other end of the third portion.

4. The vibrator device according to claim 1, wherein the first surface of the element substrate and the third surface of the first substrate are bonded to each other via a first bonding member, the second surface of the element substrate and the fifth surface of the second substrate are bonded to each other via a second bonding member, and at least one of the first bonding member and the second bonding member surrounds the through electrode with a gap between the first bonding member or the second bonding member and the through electrode.

* * * * *